US010049895B2

(12) United States Patent
Wojtowicz et al.

(10) Patent No.: US 10,049,895 B2
(45) Date of Patent: Aug. 14, 2018

(54) THERMAL BLOCK ASSEMBLIES AND INSTRUMENTS PROVIDING LOW THERMAL NON-UNIFORMITY FOR RAPID THERMAL CYCLING

(75) Inventors: Janusz Wojtowicz, Sunnyvale, CA (US); Geoffrey Dahlhoff, Menlo Park, CA (US); Douglas W. Grunewald, Livermore, CA (US); Thomas A. Conner, Mountain View, CA (US)

(73) Assignee: Life Technologies Corporation, Carlsbad, CA (US)

( * ) Notice: Subject to any disclaimer, the term of this patent is extended or adjusted under 35 U.S.C. 154(b) by 179 days.

(21) Appl. No.: 12/874,112

(22) Filed: Sep. 1, 2010

(65) Prior Publication Data
US 2011/0056661 A1    Mar. 10, 2011

Related U.S. Application Data

(60) Provisional application No. 61/239,012, filed on Sep. 1, 2009.

(51) Int. Cl.
| | |
|---|---|
| *G01K 17/00* | (2006.01) |
| *H01L 21/48* | (2006.01) |
| *H01L 23/467* | (2006.01) |
| *F28D 21/00* | (2006.01) |

(52) U.S. Cl.
CPC ........ *H01L 21/4882* (2013.01); *H01L 23/467* (2013.01); *F28D 2021/0029* (2013.01); *H01L 2924/0002* (2013.01)

(58) Field of Classification Search
CPC .......... G01K 1/12; G01K 17/00; G01K 17/06; G01K 1/14; H01L 23/34; C04B 24/383; C04B 28/02; G01J 5/12

USPC ..... 374/10–12, 5, 43–45, 102, 29, 137, 141, 374/208; 257/706; 361/709–712

See application file for complete search history.

(56) References Cited

U.S. PATENT DOCUMENTS

| | | | | |
|---|---|---|---|---|
| 3,566,959 A | * | 3/1971 | Koltuniak | ................. F28F 1/16 165/185 |
| 4,345,837 A | | 8/1982 | Kallet | |
| 4,753,290 A | * | 6/1988 | Gabuzda | ....................... 165/185 |
| 5,038,852 A | | 8/1991 | Johnson et al. | |

(Continued)

FOREIGN PATENT DOCUMENTS

| | | |
|---|---|---|
| GB | 2188163 A * | 9/1987 |
| WO | WO 98/43740 A2 | 10/1998 |

(Continued)

OTHER PUBLICATIONS

*Thermal Cycler Temperature Verification System* for GeneAmp® PCR Systems with a 0.2-ml Sample Block, User Guide, Chapter 4, Part No. 4319092 Rev. D, Applied Biosystems, 2006 , pp. 4-1 to 4-12.

(Continued)

*Primary Examiner* — Gail Kaplan Verbitsky
(74) *Attorney, Agent, or Firm* — Mauriel Kapouytian Woods LLP; Michael Mauriel

(57) ABSTRACT

The present teachings disclose various embodiments of a thermal block assembly having low thermal non-uniformity throughout the thermal block assembly. Accordingly, various embodiments of thermal block assemblies having such low thermal non-uniformity provide for desired performance of bioanalysis instrumentation utilizing such thermal block assemblies.

38 Claims, 20 Drawing Sheets

(56) References Cited

U.S. PATENT DOCUMENTS

| | | | |
|---|---|---|---|
| 5,318,361 A * | 6/1994 | Chase et al. | .................... 374/57 |
| 5,475,610 A | 12/1995 | Atwood et al. | |
| 5,616,301 A | 4/1997 | Moser et al. | |
| 6,039,471 A * | 3/2000 | Wyland | .................... G01K 7/01 |
| | | | 374/43 |
| 6,334,980 B1 | 1/2002 | Hayes et al. | |
| 6,337,435 B1 | 1/2002 | Chu et al. | |
| 6,372,486 B1 * | 4/2002 | Fripp | ................ 435/303.1 |
| 6,496,373 B1 * | 12/2002 | Chung | .............. H01L 23/3737 |
| | | | 156/306.6 |
| 6,556,940 B1 * | 4/2003 | Tretiakov et al. | ............ 702/130 |
| 6,677,151 B2 | 1/2004 | Sandell | |
| 6,703,236 B2 | 3/2004 | Atwood | |
| 6,730,883 B2 | 5/2004 | Brown et al. | |
| 6,962,821 B2 | 11/2005 | Danssaert et al. | |
| 7,005,617 B2 | 2/2006 | Brown | |
| 7,133,726 B1 | 11/2006 | Atwood et al. | |
| 7,851,185 B2 * | 12/2010 | Dale et al. | ................... 435/91.2 |
| 8,246,243 B2 * | 8/2012 | Atwood et al. | ................... 374/1 |
| 2002/0030044 A1 | 3/2002 | Brown et al. | |
| 2002/0075653 A1 * | 6/2002 | Lin | .................... H01L 23/3672 |
| | | | 361/703 |
| 2004/0241048 A1 | 12/2004 | Shin et al. | |
| 2005/0061476 A1 | 3/2005 | Artman et al. | |
| 2005/0145273 A1 | 7/2005 | Atwood et al. | |
| 2006/0207746 A1 * | 9/2006 | Bhatti | ................ H01L 23/4735 |
| | | | 165/80.3 |
| 2007/0153476 A1 | 7/2007 | Yang et al. | |
| 2008/0061429 A1 * | 3/2008 | Cohen et al. | .................... 257/706 |
| 2008/0128118 A1 * | 6/2008 | Chen | .................... H01L 23/3672 |
| | | | 165/104.33 |
| 2008/0266806 A1 * | 10/2008 | Lakin | ................. H05K 7/20409 |
| | | | 361/709 |
| 2009/0203120 A1 | 8/2009 | Shin et al. | |
| 2010/0002390 A1 * | 1/2010 | Jiang et al. | .................... 361/697 |
| 2011/0039305 A1 * | 2/2011 | Termaat et al. | ............... 435/91.2 |
| 2011/0081136 A1 * | 4/2011 | Dale et al. | .................... 392/407 |
| 2011/0129914 A1 * | 6/2011 | Schlaubitz et al. | ........ 435/303.1 |
| 2012/0097372 A1 * | 4/2012 | Furumoto | ........... H01L 23/3672 |
| | | | 165/104.26 |
| 2013/0032323 A1 * | 2/2013 | Hsu | ........................... F28F 3/02 |
| | | | 165/185 |

FOREIGN PATENT DOCUMENTS

| | | |
|---|---|---|
| WO | 2004/108288 A1 | 12/2004 |
| WO | 2008/091626 A1 | 7/2008 |
| WO | 2008/091629 A2 | 7/2008 |
| WO | 2009/046348 A1 | 4/2009 |

OTHER PUBLICATIONS

International Application No. PCT/US10/47573, International Search Report and Written Opinion dated Apr. 28, 2011.
European Search Report for European Application No. 10814448 dated Jan. 26, 2017.

* cited by examiner

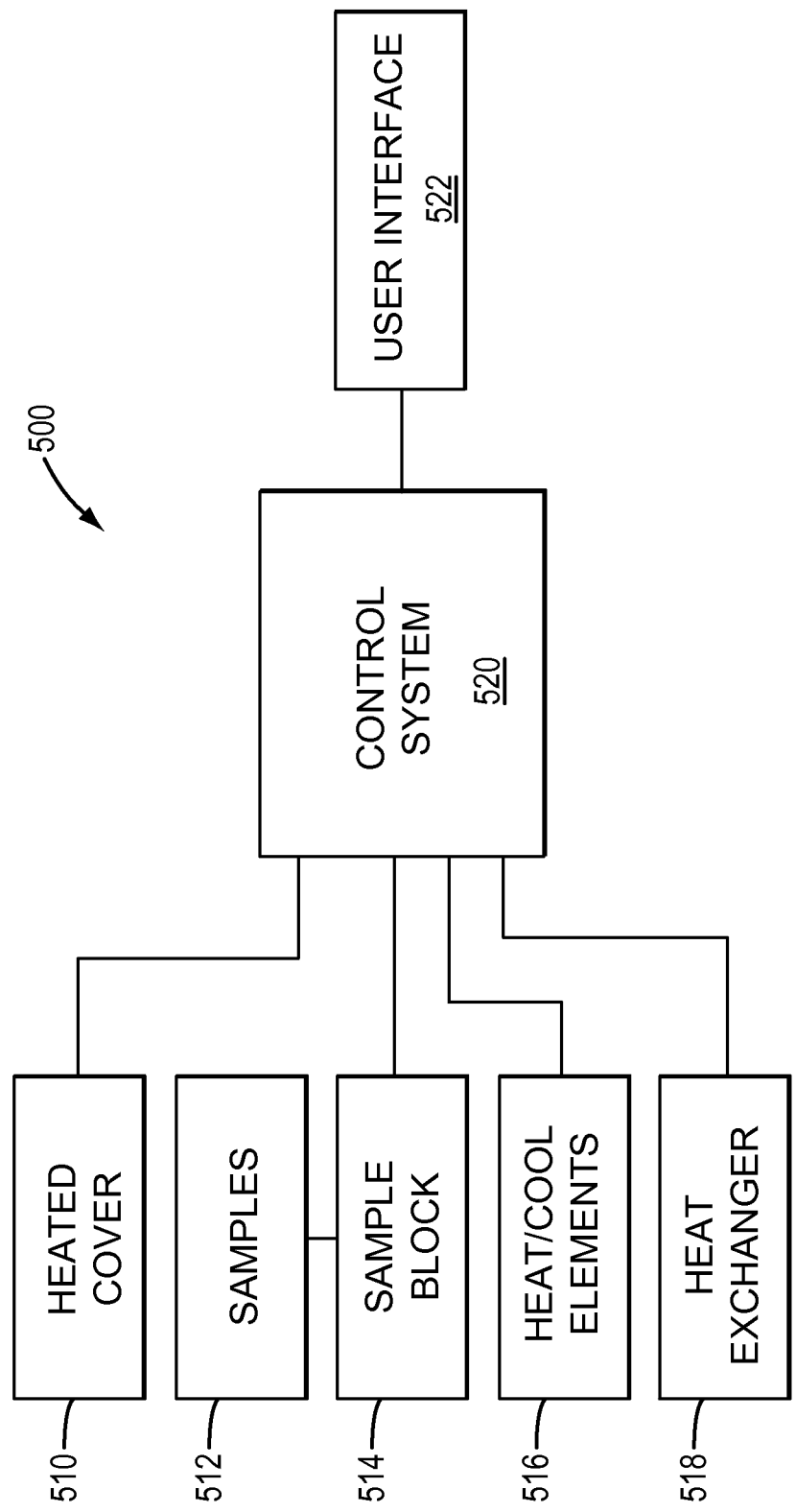

THERMAL BLOCK ASSEMBLIES AND INSTRUMENTS PROVIDING LOW THERMAL NON-UNIFORMITY FOR RAPID THERMAL CYCLING

FIELD

The field of the present teaching is for a thermal block assembly for a thermal cycling apparatus.

BACKGROUND

The analysis of thermal non-uniformity (TNU) is an established attribute of the art for characterizing the performance of a thermal block assembly, which may be used in various bioanalysis instrumentation. The TNU is typically measured in a sample block portion of a thermal block assembly, which sample block may engage a sample support device. The TNU may be expressed as either the difference or the average difference between the hottest and the coolest locations in the sample block. For example, the TNU may be determined as a difference or average difference between a hottest and a coldest sample temperature or position in a sample block. An industry standard, set in comparison with gel data, may express a TNU so defined as a difference of about 1.0° C., or an average difference of 0.5° C. Historically, the focus on reducing TNU has been directed towards the sample block. For example, it has been observed that the edges of the sample block are typically cooler than the center. One approach that has been taken to counteract such edge effects is to provide various perimeter and edge heaters around the sample block to offset the observed thermal gradient from the center to the edges.

In the present teachings, modeling was validated for comparing trends in various thermal block assembly designs using experimental data. Such modeling lead to a redesign of the thermal block assembly, which embodiments according to the present teachings are in contrast to various established teachings of the art.

BRIEF DESCRIPTION OF THE DRAWINGS

FIG. 16 is a block diagram of an instrument that may utilize various embodiments of a thermal block assembly.

DETAILED DESCRIPTION

The present teachings disclose various embodiments of a thermal block assembly having low thermal non-uniformity throughout the assembly. As will be discussed in more detail subsequently, various embodiments of thermal block assemblies having such low thermal non-uniformity provide for desired performance of bioanalysis instrumentation utilizing such thermal block assemblies.

Figure 1A:
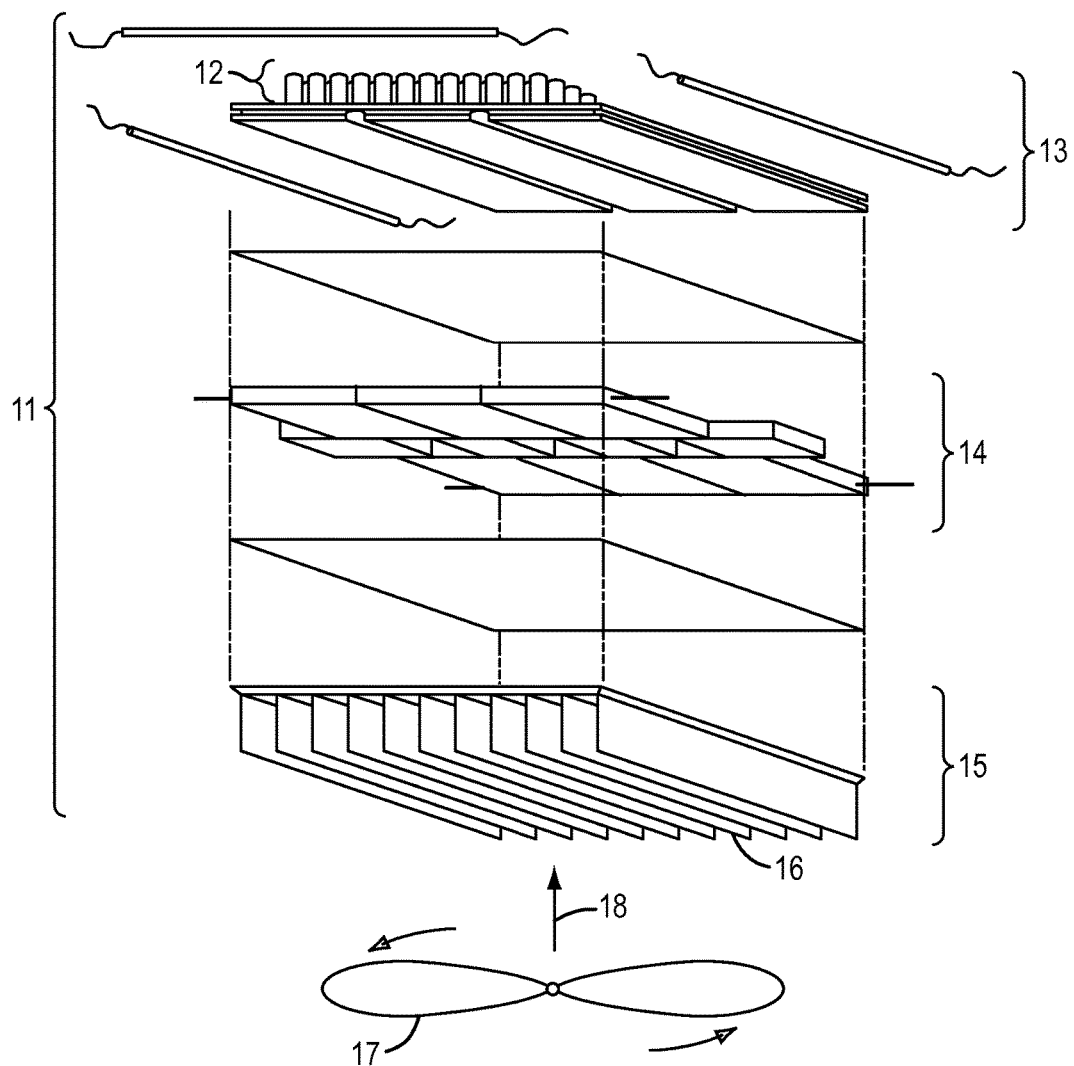
FIG. 1A and FIG. 1B are figures of various prior art thermal block assemblies.
Figure 1B:
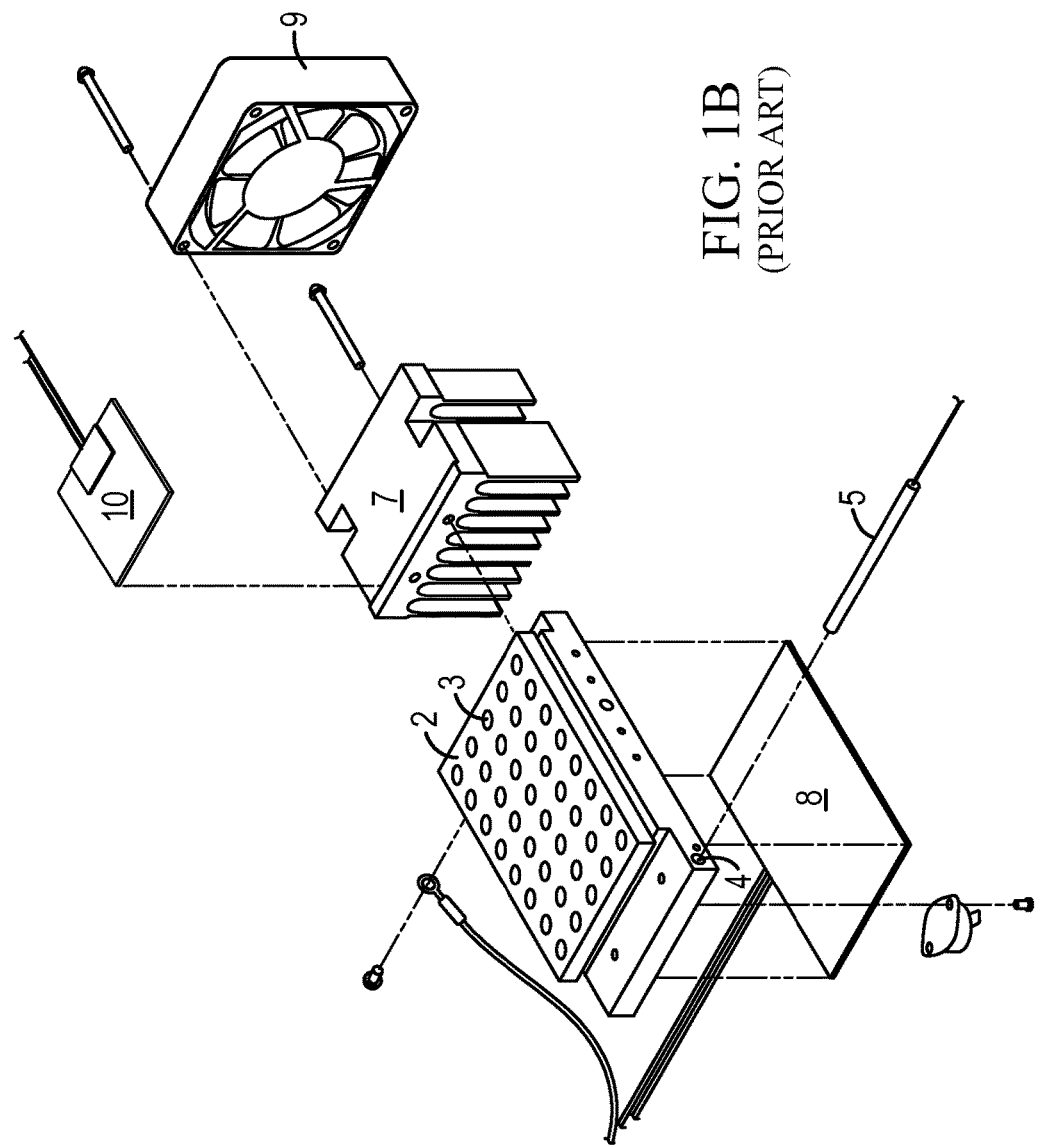

For understanding aspects of the present teachings, consideration of some of the teachings representative of the art of thermal block assemblies for bioanalysis may add perspective. In FIG. 1A, a thermal block assembly depicted includes a sample block sub-assembly with reaction wells (12) placed upon base plate (13), a thermal control sub-assembly (14) that includes a plurality of thermal electric devices, a heat sink sub-assembly (15) with fins (16), and a fan (17) (see Chu et al. U.S. Pat. No. 6,962,821). For the purpose of the present teachings, it is worthy to note the position of the fan beneath the heat sink sub-assembly, and the arrangement of the thermal electric devices in the thermal control sub-assembly; most particularly the arrangement in which gaps between the thermal electric devices are evident. In FIG. 1B, the thermal block assembly depicted includes a sample block (2), with a resistive heater (5) built into the sample block (2) by insertion into through hole (4), where sample block (2) includes wells (3) for holding reaction vessels. Optionally, the thermal block assembly of FIG. 1B also includes heat sink (7) operated with fan (9), as well as resistive heaters (8) and (10) (see Danssaert et al. U.S. Pat. No. 6,962,821). In this thermal block assembly;

particularly designed for producing a gradient across sample block (3), the use of resistive heating, as well as the optional use of the heat sink for creating a gradient across the sample block are noteworthy. In particular, fan (9) is a type of axial fan commonly used in the art in conjunction with various heat sink sub-assemblies, such as heat sink sub-assemblies similar to that shown in FIG. 1A, having the fan directed at the bottom of the heat sink. As will be discussed in more detail subsequently, the design of the heat sink sub-assembly, as well as the type and position of the fan have been carefully considered in various embodiments of a thermal block assembly, according to the present teachings.

The challenge of rapid thermal cycling for bioanalysis is conveyed in the following, excerpted from Atwood, U.S. Pat. No. 6,703,236 (col. 4, lines 3-19):

"Of course, the size of the metal block which is necessary to heat and cool 96 samples in an 8×12 well array on 9 millimeter centers is fairly large. This large area block creates multiple challenging engineering problems for the design of a PCR instrument which is capable of heating and cooling such a block very rapidly in a temperature range generally from 0 to 100° C. with very little tolerance for temperature variations between samples. . . ."

Additionally, it should be noted that another aspect of teachings of the art of the design and function of a thermal block assembly for bioanalysis instrumentation relates to the size of the heat sink sub-assembly relative to the rest of the thermal block assembly. As a rough rule of thumb, it has been held in the art that the heat sink would need to be sizeable in order to be an effective thermal buffer, and to effectively withdraw heat from the thermal electric devices, in order to maintain the performance of the thermal electric devices according to their specifications. This is conveyed in the following, excerpted from Atwood, U.S. Pat. No. 7,133,726 (col. 7, lines 49-55):

" . . . The thermal mass of the heat sink is considerably larger than the thermal mass of the sample block and samples combined. The sample block and samples together have a thermal mass of approximately 100 joules/° K. and that of the heat sink is approximately 900 joules/° K. . . ."

Accordingly, a careful study of various commercially available thermal cycling instruments would reveal a sizable heat sink in relationship to the rest of the thermal block assembly.

Figure 2:
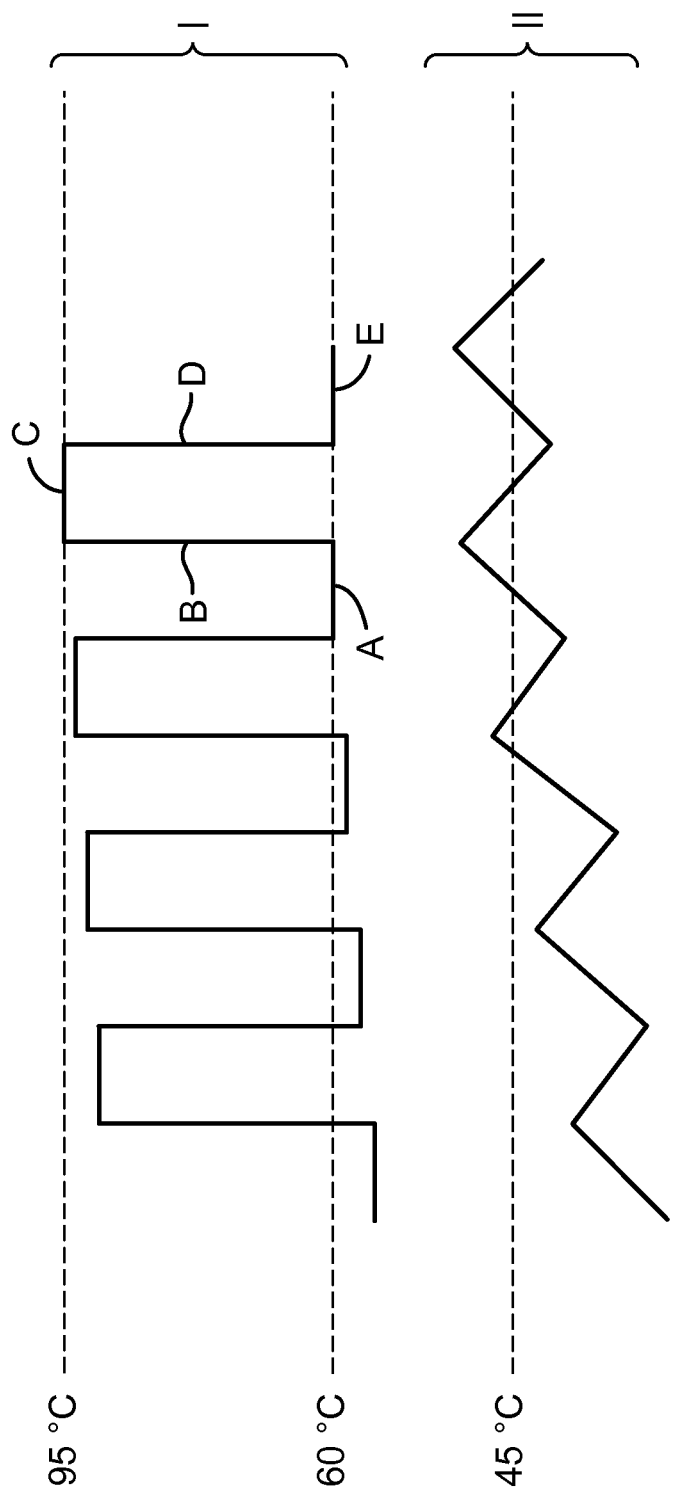
FIG. 2 is a schematic that depicts idealized thermal profiles for a sample block and heat sink for various thermal block assemblies.

With respect to the present teachings, the inventors were first struck by observations, which raised questions for which modeling studies lead them to an unexpected understanding of the challenge of providing the "very little tolerance for temperature variations between samples" noted by Atwood. For example, one of the observations made, as depicted in FIG. 2, pertained to the thermal equilibrium of embodiments of a sample block, shown in graph I, in relationship to the thermal equilibrium of embodiments of a heat sink, shown in graph II. As shown in FIG. 1A, for embodiments of thermal block assemblies utilizing thermal electric devices, a plurality of thermal electric devices may be positioned between a heat sink, and a sample block. As such, though similar factors may influence the relative nature of the thermal profiles of a sample block and a heat sink (e.g. factors impacting the observation that both tend to be hotter in the center and cooler at the edges), the sample block and heat sink may be viewed to be in the art physically decoupled. Therefore, a reason that the thermal equilibrium of the heat sink shadowed the thermal equilibrium of the sample block was not obvious.

To further an understanding of observations, such as that depicted in FIG. 2, of thermal properties of various sub-assemblies of a thermal block assembly, modeling studies of the thermal profiles of an embodiment of a heat sink and a sample block were undertaken. The validity of the predictability of the model with respect to evaluating trends in the performance of various thermal block assembly designs was verified by comparison of measurements taken for an embodiment of a heat sink in comparison to the thermal profiles generated by the model under boundary conditions that matched the operating conditions for which the measurements were taken. Once the validity of the model for looking at trends was established, modeling was used as a tool to further understand the complexity of the thermal properties of various embodiments of a thermal block assembly. In FIG. 3-FIG. 6, the model assumed that a constant heat flux was applied to various embodiments of a sample block and heat sink sub-assembly. In that regard, various sub-assemblies could be evaluated under hypothetical conditions to analyze trends in their thermal profiles.

Figure 3:
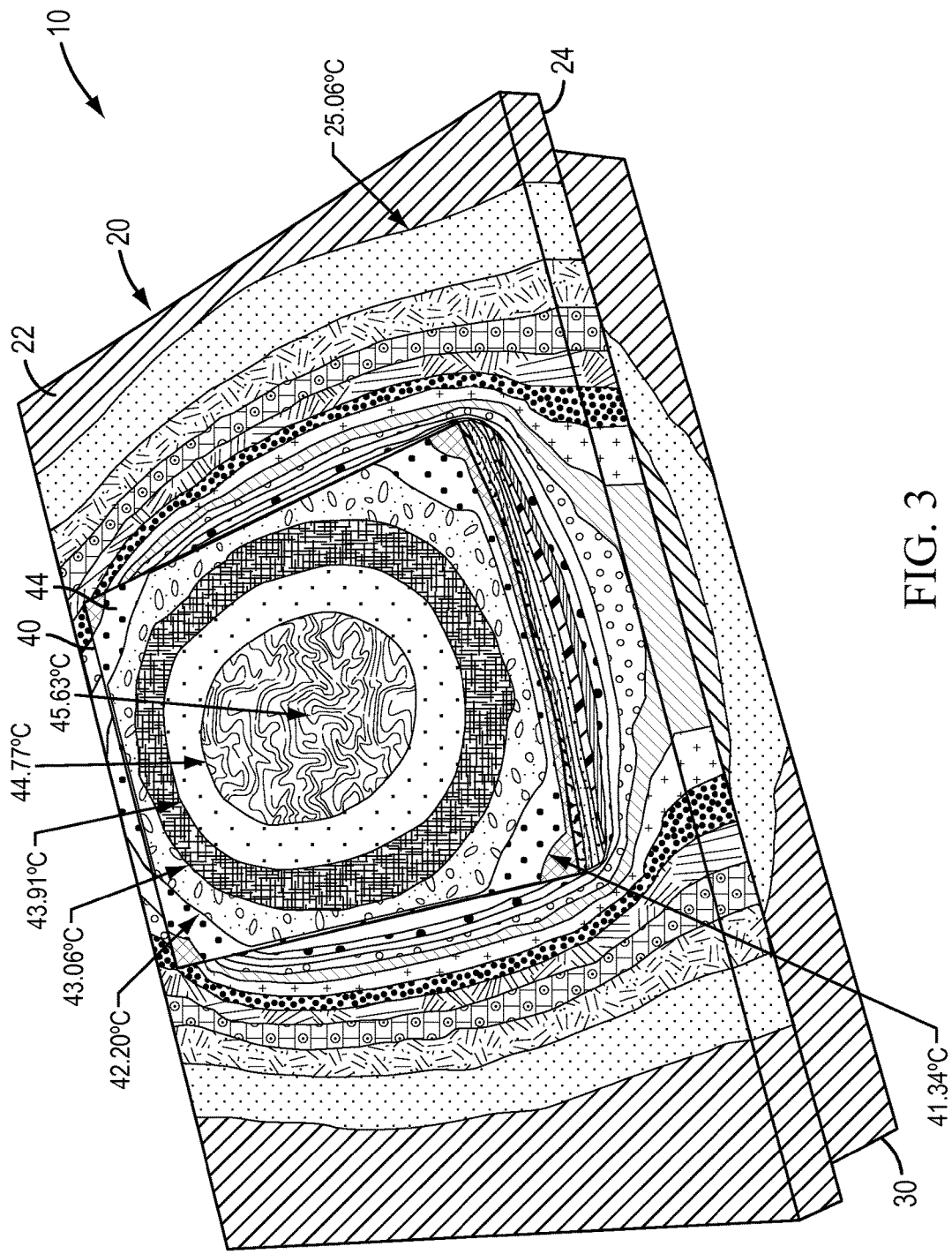
FIG. 3 depicts the thermal modeling of a heat sink, according to various thermal block assemblies.

In FIG. 3, a top perspective view of a hypothetical surface thermal profile generated by the model of an embodiment of heat sink 10 is depicted. Heat sink 10 includes base 20, having upper surface 22, and lower surface 24. Upper surface 22, includes a pedestal 40 mounted as part of the upper surface 22. Pedestal 40 as shown has a first pedestal block 42, upon which is mounted second pedestal block 44 (see also FIG. 7). Pendant the lower base surface 24 are a series of heat sink fins (30). As can be seen by the temperatures indicated with the series of thermal contour lines, from the central portion of second pedestal block 44 to the outer portion of upper base surface 22 is a difference of about 20° C. Additionally, from the center of second pedestal block 44 to its edge, there is a difference of about 4° C. Upon pedestal 40, a thermal control sub-assembly may be mounted that includes a plurality of thermal electric devices (not shown). Upon the thermal control sub-assembly, a sample block may be mounted.

Figure 4:
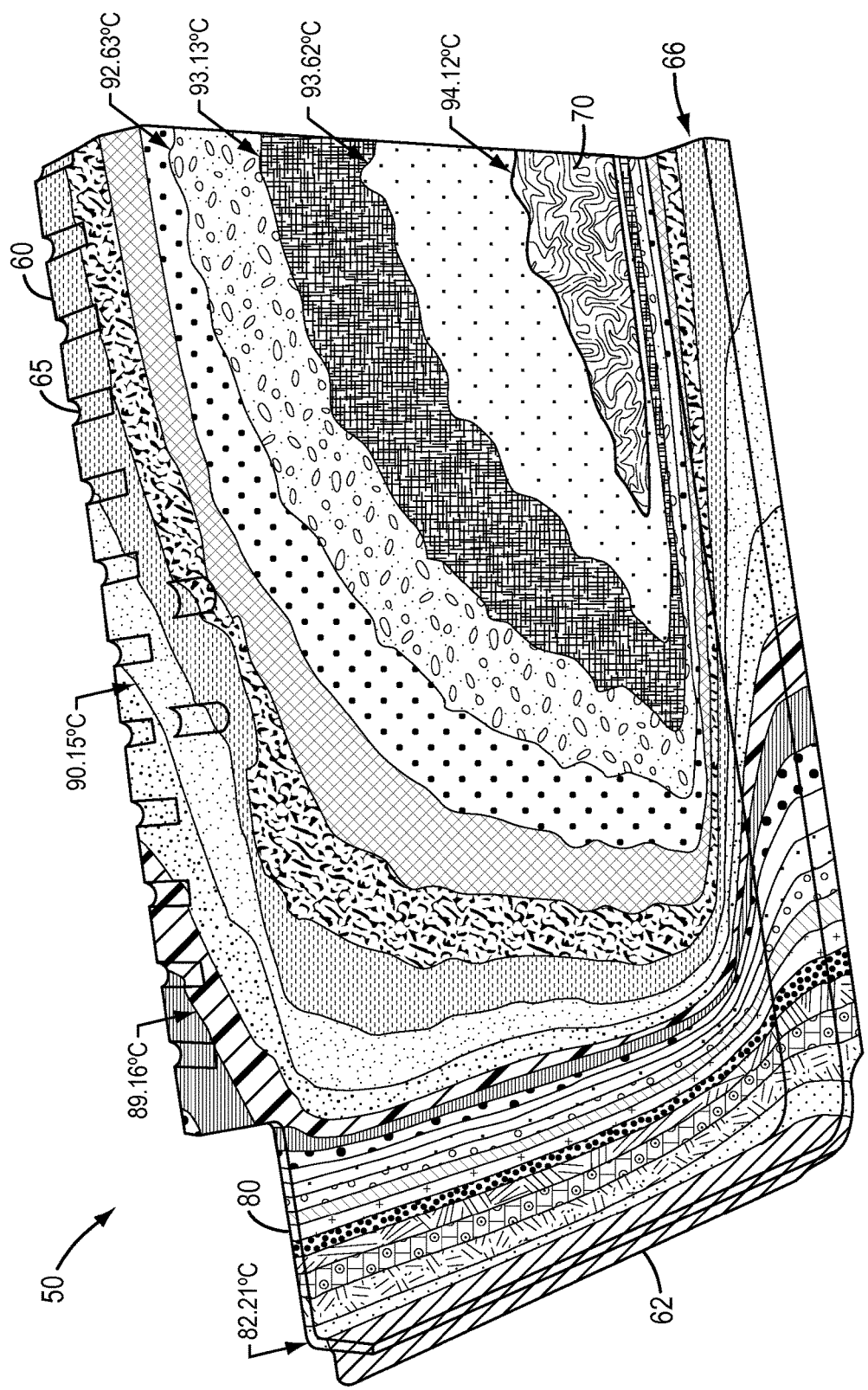
FIG. 4 depicts the thermal modeling of a sample block, according to various thermal block assemblies.

In FIG. 4, a bottom perspective view is depicted of a quarter section of a sample block that may be utilized in embodiments of a thermal block assembly including embodiments of a heat sink such as that shown in FIG. 3. For an embodiment of sample block 50 of FIG. 4, a hypothetical surface thermal profile generated by the model is displayed. Sample block 50 includes upper surface 60, and lower surface 70. For various embodiments of a sample block, depressions or wells 65 may be formed in upper surface 60. Flange 80 may be formed around the perimeter of sample block 50, having first flange rim 62, with opposing second flange rim (not shown), and adjoining third flange rim 66, with opposing fourth flange rim (not shown). As can be seen in FIG. 4, for the modeling under defined boundary conditions, on the lower surface 70 from about the center of sample block 50 towards first flange rim 62, there is about a 10° C. difference indicated. The trend shown in the modeling study, under the boundary conditions set for the model, suggests that for various embodiments of sample block 50 as depicted in FIG. 4, a maximum difference of about a 5° C. in thermal profiles may occur between a center-edge position close to third flange rim 66 to an edge position beneath an outer well located in proximity to first flange rim 62.

As is known in the art of bioanalysis, various embodiments of a sample block such as that depicted in FIG. 4 having wells 65, may be adapted to receive various sample-containing devices, such as a microtiter plate. Additionally, various embodiments of a sample block may have a substantially flat surface adapted to receive a substantially planar sample-containing device, such as a microcard. In a sample block having wells, such as that depicted in FIG. 4, biological samples deposited in the wells of a microtiter plate may undergo thermal cycling according to a thermal cycling profile, for example, as indicated in graph I of FIG. 2. It should be noted that the thermal cycling profile of graph I in FIG. 2 is idealized for the purpose of describing an observation made regarding the thermal equilibration of a sample block in relationship to the thermal equilibration of a heat sink.

A two setpoint thermal cycle, as shown in the idealized thermal cycling profile of graph I in FIG. 2 may include setpoint temperature for a denaturation step and a setpoint temperature for an annealing/extension step. Setpoint temperatures for a denaturation step may be between about 94-98° C., while setpoint temperatures for an annealing/extension step may be between about 50-65° C. In FIG. 2, the portions of the curve designated A and E indicate an annealing/extension step in the thermal cycle at about 60° C., while the region designated C is a denaturation step at about 95° C. in the thermal cycle. Additionally, two temperature ramp portions of the curve are indicated by regions B and D. Alternatively, some protocols use a three setpoint temperature protocol, in which the annealing and extension steps are separate steps. According to various protocols, the setpoint temperature for an extension step may be between about 75-80° C. During the defined steps of a thermal cycle, in order to allow time for the chemical process at that step, a specified hold time for the setpoint temperature may be defined. As can be seen in idealized graph I of FIG. 2, a hold time at a setpoint temperature is where the setpoint temperature is effectively a constant at that step. In the idealized graph I of FIG. 2, the hold times at the denaturation setpoint temperature and the annealing/extension setpoint temperature appear to be about the same, but as one of ordinary skill in the art is apprised the hold times for various steps in a thermal cycle may be for different. For example, during a thermal cycle, the hold time at the denaturation setpoint temperature for a denaturation step may be between about 5 seconds to about 15 seconds, while the hold time at the annealing/extension setpoint temperature for an annealing/extension step may be between about 35 seconds to about 1 minute. Various thermal cycle protocols may be vary according to the nature of the instrument, chemistry and sample.

The actual measurement of thermal variation across a sample block integrated into an instrument, and under real operating conditions may be performed by an end user. Such thermal variation across a sample block, which may result in thermal variation across samples, is known in the art of thermal cycling biological samples as the sample block thermal non-uniformity (TNU). As such, under targeted conditions producing the "very little tolerance for temperature variations between samples" described by Atwood, there is still some measurable TNU. Accordingly, the evaluation of a thermal profile across the portion of the sample block adapted to receive a sample-containing device is of particular interest. In that regard, the hypothetical bottom surface thermal profile of FIG. 4, from a center-edge position close to third flange rim 66 to an edge position beneath an outer well located in proximity to first flange rim 62 is of particular interest. Moreover, in the field of the physics and engineering of thermal block assemblies utilized in various bioanalysis instrumentation, the values of TNU at defined intervals, as well as the time to a targeted thermal uniformity may be metrics used to assess instrument function.

Defining an acceptably targeted TNU for a thermal block assembly used in bioanalysis instrumentation is done in accordance with a targeted precision of a bioassay run on such instrumentation. For example, but not limited by, for various bioassays based on the PCR reaction, having an acceptably determined TNU on instrumentation utilizing various embodiments of a thermal block assembly may be useful for assuring that an acceptable precision for a cycle threshold value may be generated on such instrumentation. Therefore, providing an end user a means for evaluating the TNU could provide for the assessment of within-instrument and between-instrument performance for generating acceptable precision in various data sets. As previously mentioned, TNU may be determined by an actual measurement of variation of temperature across a sample block, for example, but not limited by, across sample wells in a sample block sub-assembly adapted to receive a sample-containing device, such as a microtiter plate, or across a flat surface, for a sample block without depressions. A procedure for determining the TNU of a sample block in a thermal cycling instrument can be found in manuals, for example, such as, "Thermal Cycler Temperature Verification System"; Part Number 4319092 Rev. D; Chapter 4, Applied Biosystems.

In such a protocol, a temperature is recorded for a predetermined number and pattern of wells to be tested, and the variation across the wells is determined, and then compared to a standard value. According to various definitions of TNU in the art, TNU may be defined as the difference between the highest temperature value recorded and the lowest temperature recorded for the predetermined number of wells tested. For various definitions of TNU in the art, TNU may be defined as the average difference between the highest temperature value recorded and the lowest temperature recorded. In the field of the physics and engineering of thermal cycling instruments, a TNU of 1.0° C. expressed as a difference of the temperature range over a sample block, or a TNU of 0.5° C. expressed as an average difference of a temperature range over a sample block is often found recited in the art as standard targeted values of TNU.

As such, both definitions are based on a difference expressing the range of temperatures across sample wells to fall within not more than about a 1.0° C. Such a definition may have evolved from the necessary comparison to gel data, which was the tool of the art before thermal cycling instrumentation was available. Various definitions of TNU, based on various testing protocols, may be possible, where the objective of such protocols may be to provide a basis for evaluation of apparatus performance. For example, the testing protocol described in the above referenced manual records the temperature of a plurality of wells over a sample block. Various testing protocols may be designed to record the temperature of a plurality of samples in a sample-containing device set on a sample block. Various other testing protocols may be designed to record the temperature of various positions within the sample block. Various other testing protocols may include combinations of approaches for the evaluations of TNU. Additionally, another value other than a value expressing a difference of the range of temperatures recorded for a sample block may be possible. One of ordinary skill in the art will appreciate that the objective of any such protocol for the determination of TNU and value used to evaluate a TNU determination would be based on providing assessment of within-instrument and between-instrument performance. Evaluation of within-instrument and between-instrument performance may be useful in order to provide assurance that acceptable precision for data sets may be generated on instrumentation utilizing various embodiments of a thermal block assembly.

As previously mentioned, the time to a targeted thermal uniformity may also provide a metric useful for the assessment of instrument function, as the time-to-TNU may be related to the total cycling time. Generally, the time-to-TNU may be described as the time that a target TNU may be achieved after a hold time has been initiated for a target setpoint temperature. According to various embodiments of a thermal block assembly and instrument of the present teachings, a value for a target setpoint temperature may be based on a temperature measured in a plurality of samples in a sample support device. In various embodiments of a thermal block assembly and instrument of the present teachings, a value for a target setpoint temperature may be based on a temperature measured in a plurality of positions in a sample block. As one of ordinary skill in the art will appreciate, there is a direct relationship between the time-to-TNU and the cycle time, so that the faster the time-to-TNU, the shorter the cycle time. The impact of a shorter cycle time is to provide for a greater number of cycles per unit period of time. Therefore, a faster time-to-TNU may provide for a faster rate of cycling.

In reference to the idealized thermal cycle profile shown in idealized graph I of FIG. 2, a TNU may be determined on measurements on a sample block taken at time intervals after $t_0$, where $t_0$ according to the present teachings is referred to as clockstart. Generally, clockstart may be defined as a time associated with a temperature approaching a setpoint temperature. For example, but not limited by, clockstart may be initiated at a temperature within about 1° C. of a setpoint temperature. According to various embodiments of a thermal block assembly and instrument of the present teachings, a value for a temperature on which clockstart is initiated may be based on a temperature measured in a plurality of samples in a sample support device. In various embodiments of a thermal block assembly and instrument of the present teachings, a value for a temperature on which clockstart is initiated may be based on a temperature measured in a plurality of positions in a sample block.

As will be discussed in more detail subsequently, a TNU may be determined at, for example, 10, 20 and 30 seconds after clockstart ($t_0$), which may be TNU determinations taken during an essentially constant temperature portion of a cycle, or hold time portion of a cycle for a targeted setpoint temperature, as previously discussed. For the purpose of the present teachings, a TNU determination taken at a designated time after clockstart ($t_0$) during a hold-time interval is referred to as a static TNU determination, while a TNU determination taken at clockstart ($t_0$) is referred to as a dynamic TNU determination. Such measurements taken over such small time intervals may represent worst case measurements, as it is clearly easier to achieve thermal uniformity when a block is, for example, wholly equilibrated to any specific constant temperature versus a constantly changing temperature. For that reason, as one of ordinary skill in the art may appreciate, if a targeted value for a static TNU determination may be, for example, about a 1.0° C. difference across the sample block, then a dynamic TNU may be expected to reflect even greater non-uniformity.

As one of ordinary skill in the engineering arts is apprised, designing building, and testing prototypes for multi-component assemblies and instruments having complex function is a laborious and time consuming process. Though a validated modeling tool may not replace such a process, it may be helpful in giving useful information regarding which prototypes in a selection of a large plurality of prototypes to target for build/test/revise cycles. In review of observations, such as that depicted in FIG. 2, the inventors began to question the state of the teachings of the art; particularly concerning the potential coupling of thermal transfer effects between the sub-assemblies comprising a thermal block assembly. The results of the hypothetical modeling for one embodiment of several prototype designs considered for a heat sink and sample block are presented in FIG. 5 and FIG. 6, respectively.

Embodiments of a potential prototype heat sink 100 as depicted in top perspective view FIG. 5 include a base 120 having upper surface (first surface) 122 and a plurality of fins 130 pendent a second surface 124 below the base. Alternating between the fins 130, are a plurality of flow paths 132. In comparison to embodiments of heat sink 10 of FIG. 3, there is no pedestal 40, which is a part of upper surface 22 of heat sink 10. In that regard, as will be evident subsequently, various embodiments of a sample block may have essentially the same footprint as embodiments of heat sink 100 of FIG. 5. In contrast, various embodiments of sample block 50 of FIG. 4 match only the footprint of the pedestal portion 40 of upper surface 22 of heat sink 10 of FIG. 3. According to trends resulting from the modeling study, various embodiments of a heat sink, such as heat sink 100 of FIG. 5 may have a temperature difference across the heat sink of about 1.0° C. in contrast to the about 4° C. across second pedestal surface 44 for embodiments of heat sink 10 of FIG. 3. The model study provided for evaluation of trends indicating a substantially decreased thermal non-uniformity for various embodiments of a heat sink, such as heat sink 100 of FIG. 5 in comparison to various embodiments of a heat sink, such as heat sink 10 of FIG. 3

Figure 5:
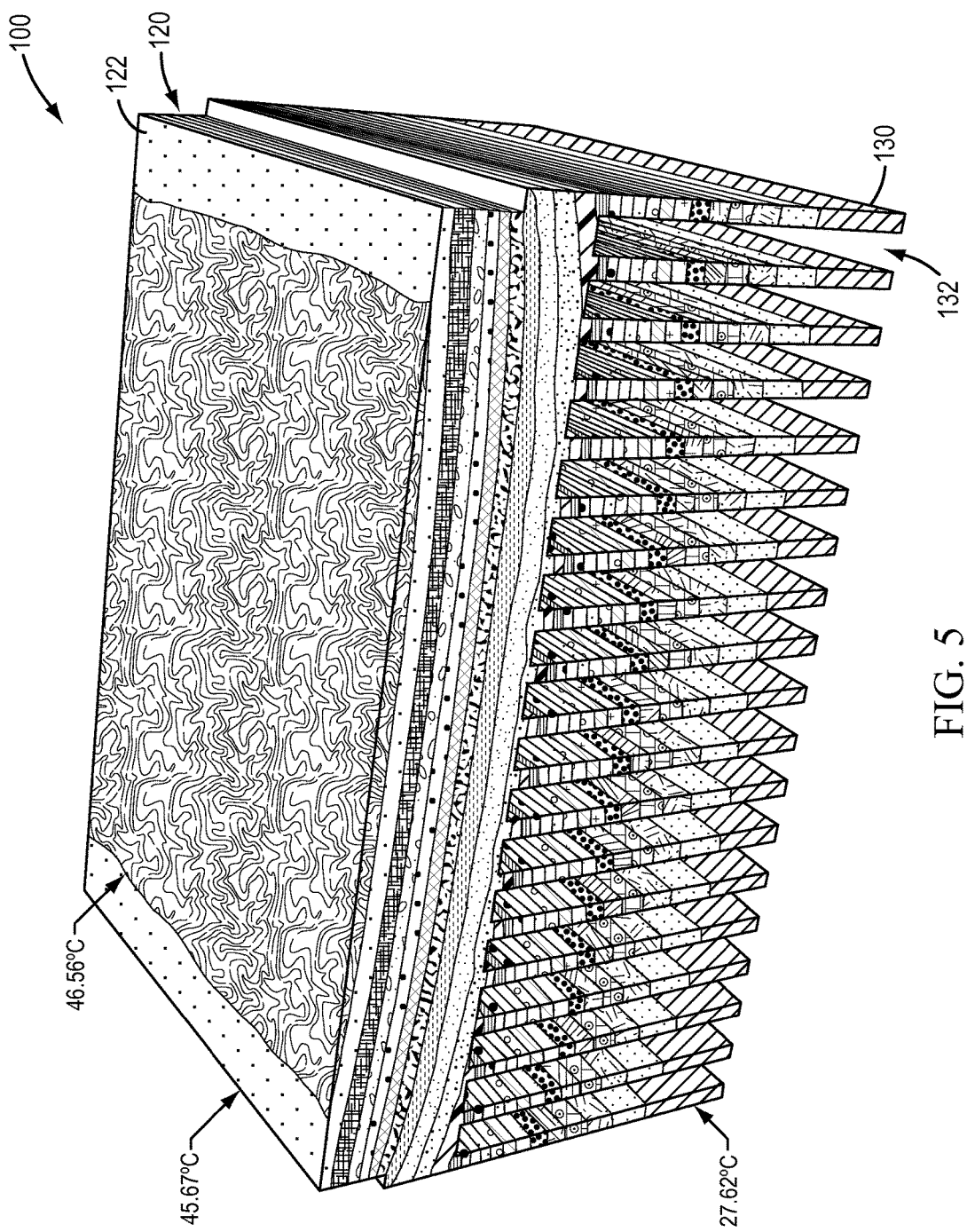
FIG. 5 depicts the thermal modeling of a heat sink, according to various embodiments of a thermal block assembly providing low thermal non-uniformity (TNU).
Figure 6:
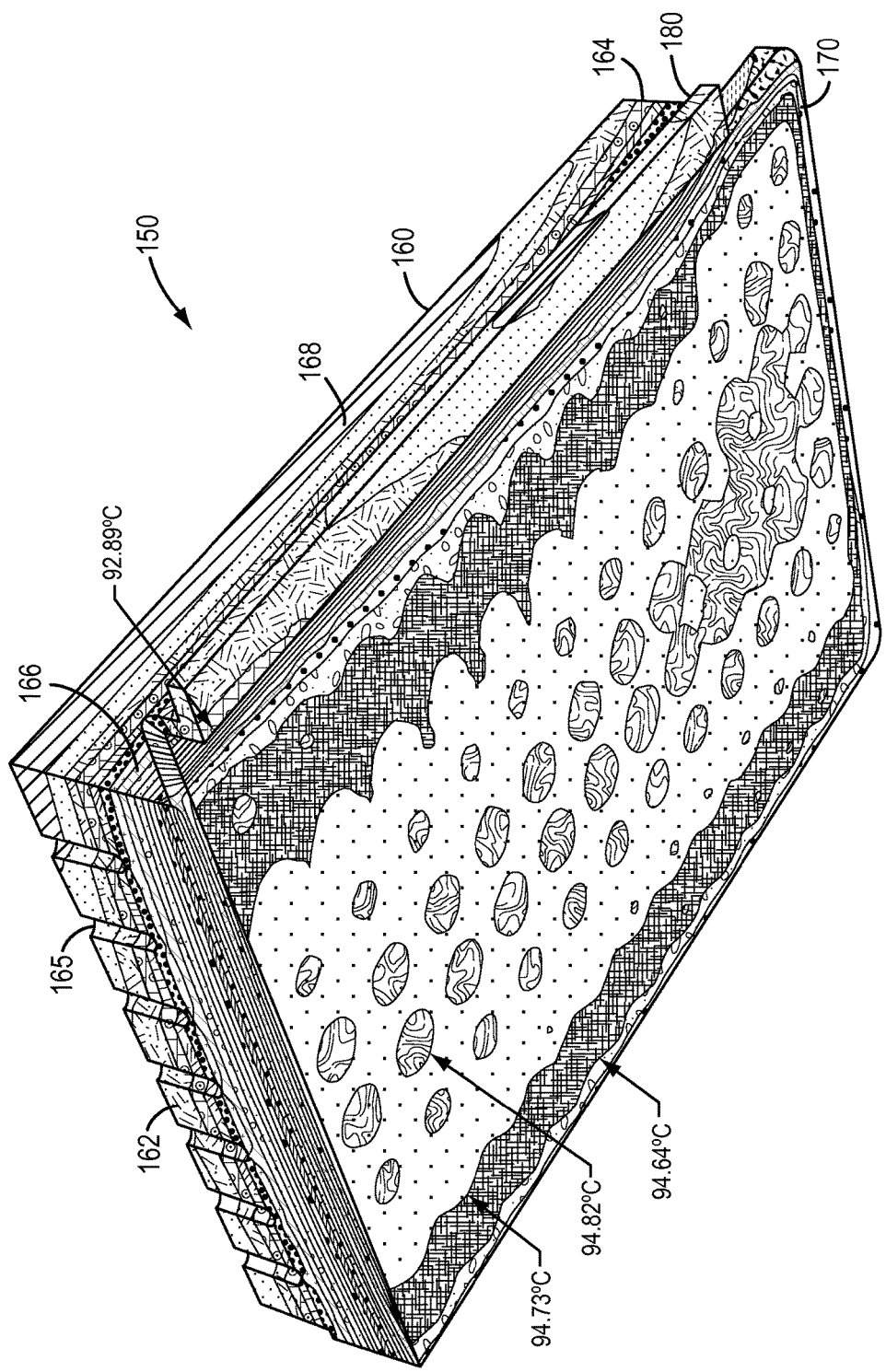
FIG. 6 depicts the thermal modeling of a sample block, according to various embodiments of a thermal block assembly providing low thermal non-uniformity (TNU).

Embodiments of a potential prototype sample block 150 as depicted in bottom perspective view FIG. 6 include an upper surface 160, having a plurality of depressions or wells 165, and a lower surface 170. Additionally, sample block 150 has first side 162, having opposing second side 164. Adjoining first side 162 is third side 166, having opposing fourth side 168. It should be noted that flange 180 is substantially reduced in comparison to flange 80 of sample block 50 depicted in FIG. 4. As shown in FIG. 6, for various embodiments of sample block 150, flange 180 is associated with third side 166 and fourth side 168, which flange 180 has been optimized to reduce the horizontal flow of heat, in order to assess the potential impact of that factor on the sample block TNU via the hypothetical modeling. As can be seen in FIG. 6, on lower surface 170 from about the center of sample block 150 towards third flange rim 166, about a 0.2° C. difference is indicated. This is in contrast to FIG. 4, in which an about 2.0° C. difference on lower surface 70 from about the center of sample block 50 towards third flange rim 66 is indicated. Further, in FIG. 6, on lower surface 170 from about the center of sample block 150 towards first flange rim 162, no appreciable difference is indicated. This is in contrast to FIG. 4, in which for sample block 50, for lower surface 70 from about the center of sample block 50 towards first flange rim 62, there is about a 10.0° C. difference indicated. As previously discussed, it should be noted that the footprint of embodiments of potential prototype heat sink 100 is essentially about the same as the footprint of potential prototype sample block 150. Surprisingly, the modeling of a proposed prototype, in contrast to established teachings of the art, suggests that a substantially larger heat sink may have an impact on increasing the TNU of a sample block. Based on these findings, embodiments of a prototype design of a heat sink and a sample block, as suggested in FIG. 5 and FIG. 6, respectively, were fabricated and tested.

Figure 7:
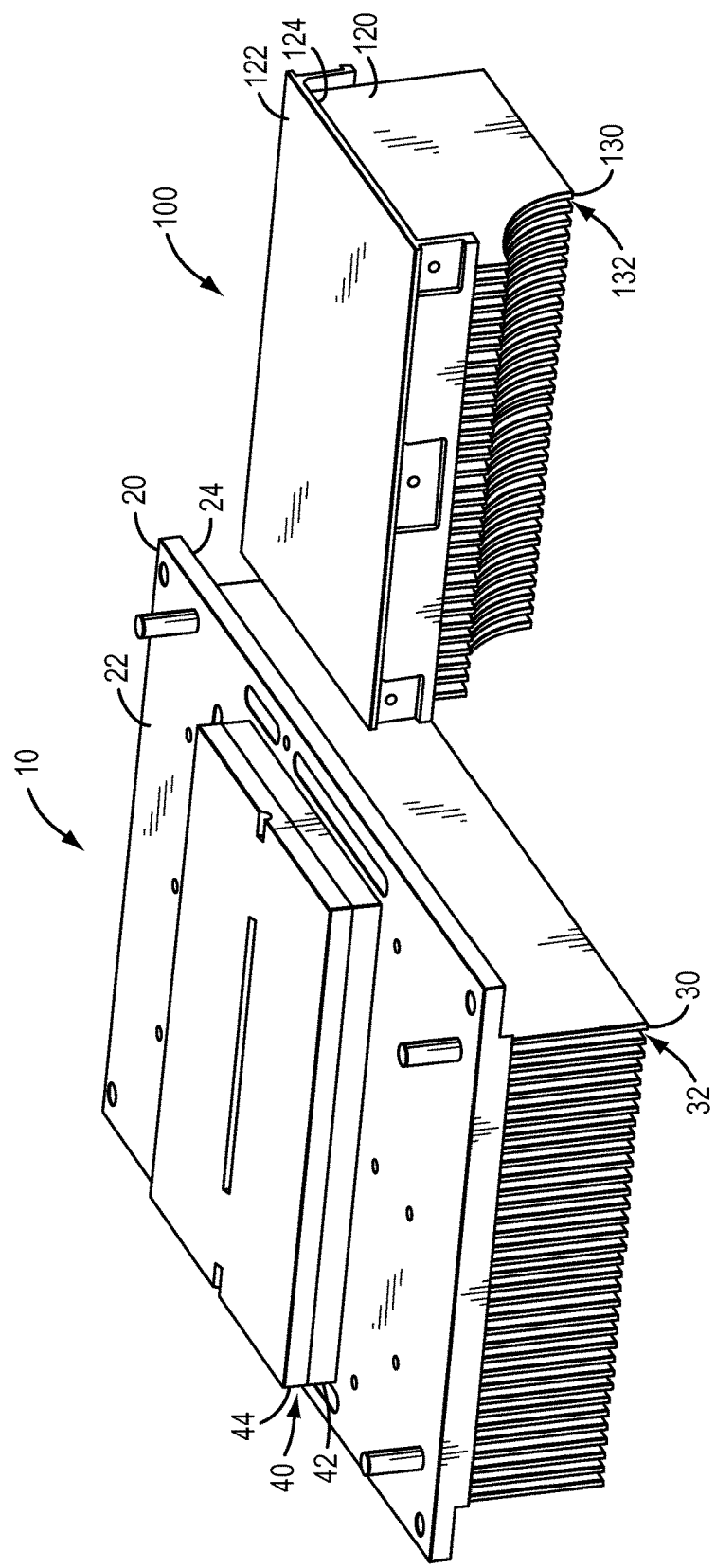
FIG. 7 is a perspective view comparing two heat sinks, according to various embodiments of a thermal block assembly.
Figure 8:
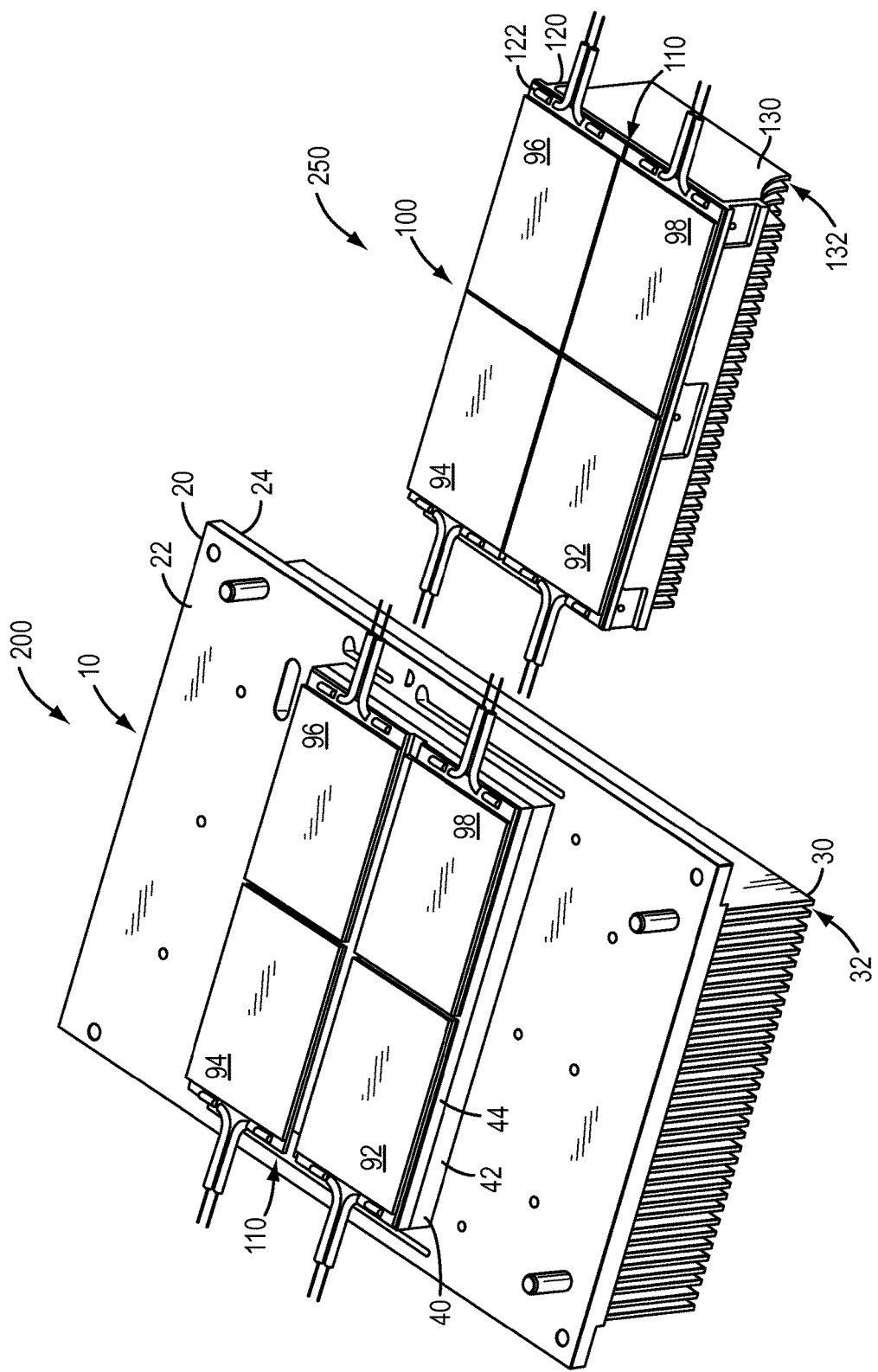
FIG. 8 is a top perspective view comparing two heat sinks each having a thermal control sub-assembly mounted thereupon, according to various embodiments of a thermal block assembly.

FIG. 7 is a perspective view comparing an embodiment of heat sink 10, such as that modeled in FIG. 3 in comparison to an embodiment of heat sink 100 fabricated after the model depicted in FIG. 5. It should be noted that for heat sink 100, fins 130 have flow paths 132 that are the longest near base 120 of the heat sink 100, as will be discussed in more detail subsequently. FIG. 8 is a perspective of an embodiment of thermal block sub-assembly 200, which includes heat sink sub-assembly 10 and a thermal control sub-assembly 110 in comparison to thermal block sub-assembly 250, which includes heat sink sub-assembly 100 and a thermal control sub-assembly 110. It should be noted that in thermal block sub-assembly 250, the thermal electric devices 92, 94, 96, and 98 are adjoined in the X-Y plane so as to provide for a combined footprint that essentially matches the footprint of upper surface 122 of heat sink 120 thereby. In contrast, for example, in thermal block sub-assembly 200, the thermal electric devices 92, and 98, as well as 94, and 96 are adjoined, but a gap exists between thermal electric devices 92 and 94, as well as thermal electric devices 96 and 98. According to various embodiments of a thermal block assembly and instrument of the present teachings, the thermal electric devices may be adjoined to a specified tolerance to provide for a combined footprint that allows, for example, room for thermal expansion of materials in such thermal electric devices. For various embodiments of a thermal block assembly and instrument according to the present teachings, a thermal control sub-assembly may have thermal electric devices adjoined to provide for a combined footprint that allows for an intervening space to an adjacent thermal electric device of no more than up to about 1 mm. For various embodiments of a thermal block assembly and instrument according to the present teachings, a thermal control sub-assembly may have thermal electric devices adjoined to provide for a combined footprint that allows for an intervening space to an adjacent thermal electric device of substantially less than about 8 mm.

Figure 9:
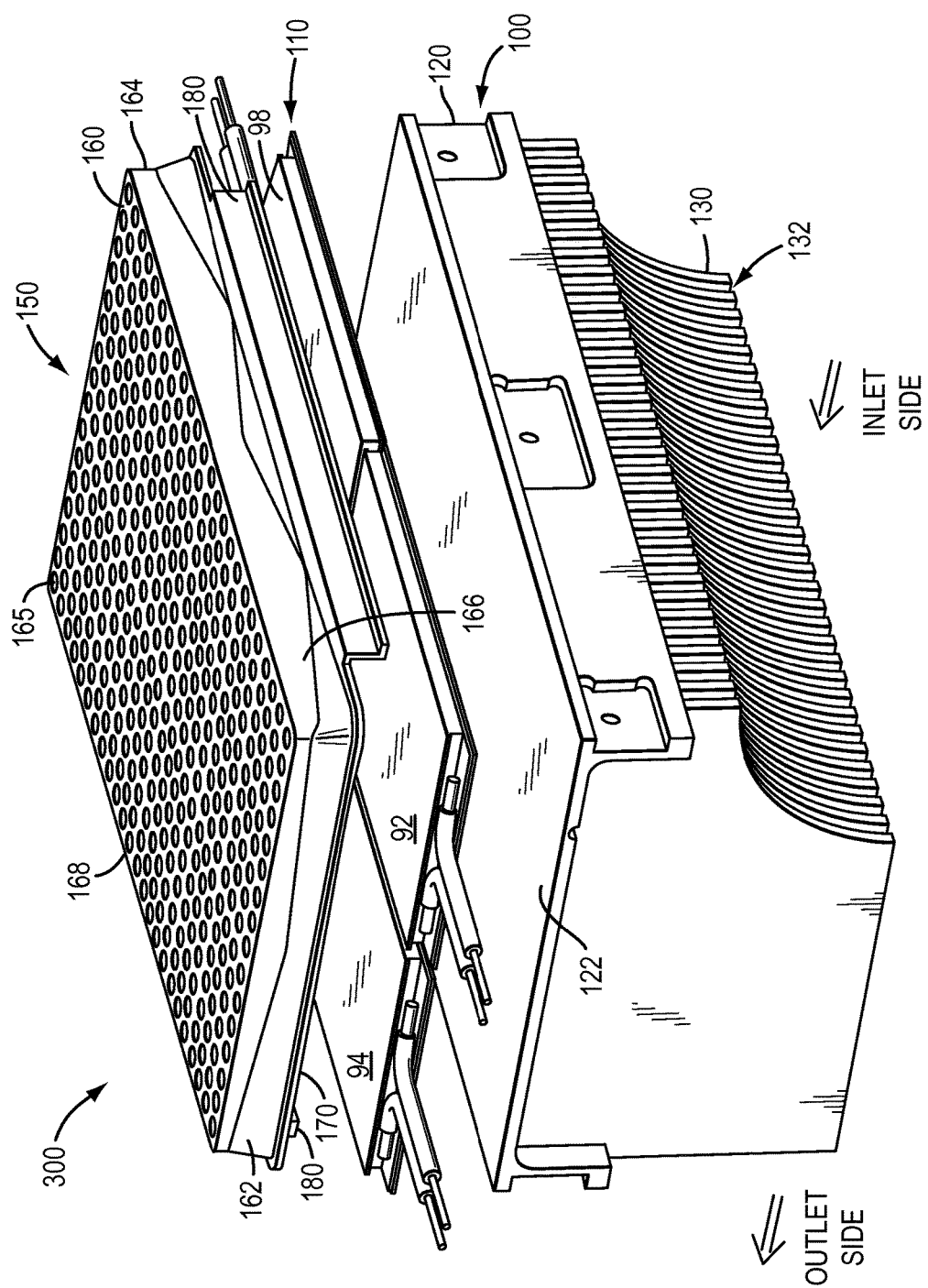
FIG. 9 is an exploded view of a thermal block assembly, according to various embodiments of a thermal block assembly.

In FIG. 9, an exploded view of an embodiment of thermal block assembly 300 according to the present teachings is shown. Various embodiments of a thermal block assembly 300 include heat sink sub-assembly 100, thermal control sub-assembly 110, and sample block sub-assembly 150. As depicted in FIG. 8, thermal control sub-assembly includes thermal electric devices that are adjoined in the X-Y plane, and positioned between the sample block 150 and heat sink 100. It should be noted that the active footprint of the adjoined thermal electric devices 92, 94, 96, and 98 essentially matches the footprint of the second surface 170 of the sample block 150 and upper surface 122 of heat sink 110. In this regard uniform contact of the thermal control sub-assembly may be provided throughout thermal block assembly 300.

As depicted in FIG. 9, various embodiments of sample block 150 may have thermal mass redistributed from first side 162, and opposing second side 164, as well as from third side 166, and opposing fourth side 168 to provide for uniform thermal mass across the block. According to various embodiments of a thermal block assembly and instrument of the present teachings, redistribution of mass on the sides of a sample block may either be the removal of mass to decrease thermal mass in various regions of a sample block, or to add mass to increase thermal mass in various regions, or a combination of addition and removal of mass in a region. Accordingly, for various embodiments of a sample block sub-assembly used in a thermal block assembly, the selective redistribution of mass from the sides of the sample block may further reduce sample block TNU. For various embodiments of a thermal block assembly and instrument according to the present teachings, a sample block sub-assembly so designed may preclude the use of various edge and perimeter heaters typically used in the art. Additionally, material from the side portions of heat sink base 120 may be removed, creating lower surface 124 thereby (see FIG. 7). According to various embodiments of a thermal block assembly and instrument according to the present teachings, such removal of material from a heat sink sub-assembly may provide for enhanced thermal uniformity of a heat-sink sub-assembly.

Figure 10:
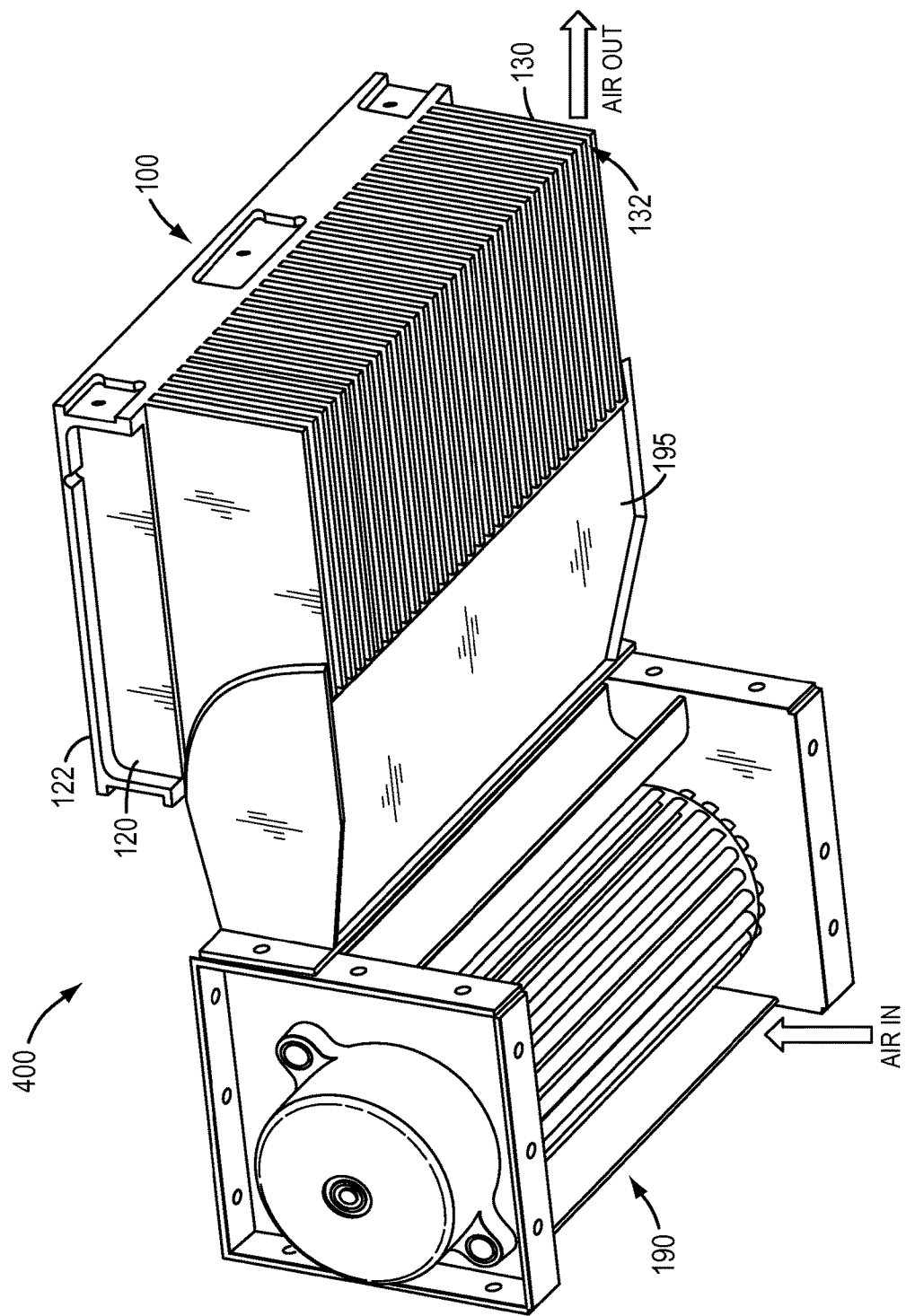
FIG. 10 is a bottom perspective view of a heat sink sub-assembly with fan mount, according to various embodiments of a thermal block assembly.

FIG. 10 depicts thermal block assembly 400, which includes heat sink sub-assembly 100 joined to an embodiment of a fan sub-assembly that includes transverse cross-flow fan 190 and duct 195. In contrast to embodiments of a thermal block assembly as shown in FIG. 1A, which depicts air blown under heat sink sub-assembly 15 at fins 16, embodiments of thermal block assembly 400 have transverse fan 190 blowing air through flow paths 132 from an inlet side of the plurality of fins to an outlet side of the plurality of fins. As previously mentioned, in addition to the position of the fan relative to the fins in FIG. 1A, an axial fan, such as the fan depicted in FIG. 1B is frequently used in the art. Such axial fans additionally suffer from a significant dead spot in the center of the fan from which no air flow emanates, which may contribute to the thermal gradient across a heat sink when such axial fans are used. Accordingly, various embodiments of thermal block assembly 400 are free of these additional sources that may contribute to thermal gradient formation in a heat sink sub-assembly. For various embodiments of sub-assembly 400, duct 195 provides a uniform flow path from the fan to the inlet side of the plurality of fins. In various embodiments of subassembly 400, duct 195 is adapted to fit securely to the inlet side of the plurality of fins, as shown in FIG. 10. According to various embodiments of sub-assembly 400, the housing may be adapted to fit proximal the inlet side of the plurality of fins. For such embodiments, the width of a gap between the housing and the inlet side may be not more than the width provided by the flow paths in order for the air flow to effectively pass through the plurality of fins, and not the gap.

Figure 11:
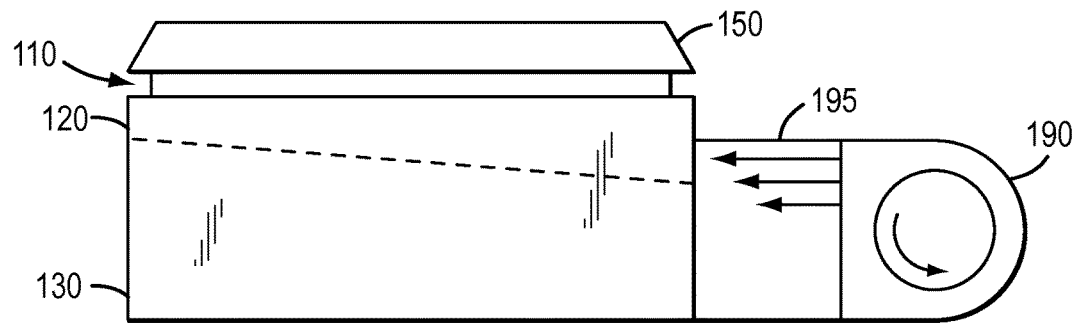
FIG. 11 is side view of a thermal block assembly, according to various embodiments of a thermal block assembly.
Figure 13:
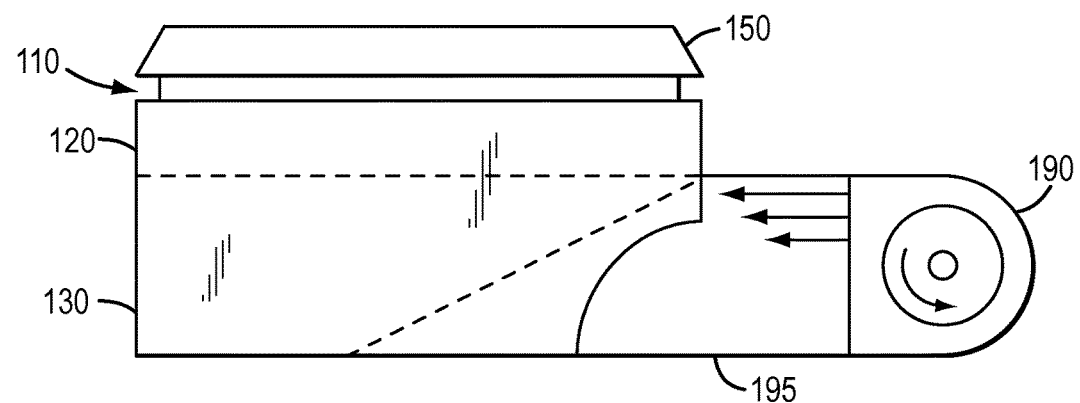
FIG. 13 is side view of a thermal block assembly, according to various embodiments of a thermal block assembly.
Figure 12A:
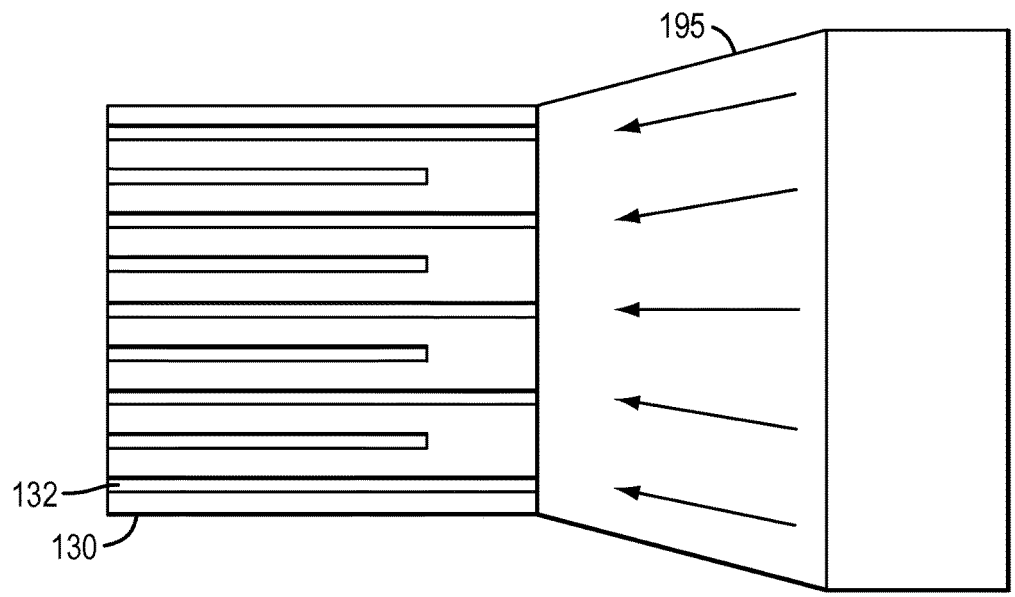
FIG. 12A is bottom view of a heat sink sub-assembly.
Figure 12B:
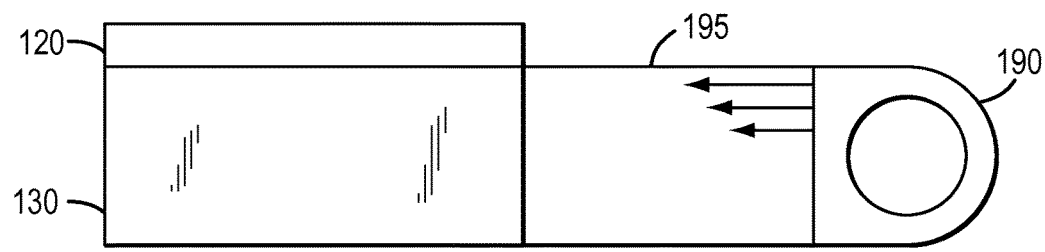
FIG. 12B is a side view of a heat sink sub-assembly, according to various embodiments of a thermal block assembly.

Further, air forced through heat sink 100 from the inlet side may become gradually warmed, thereby creating a thermal gradient. In order to compensate for a thermal gradient formed in such a manner, for various embodiments of a heat sink, varying the height of fins 130 from the inlet end to the outlet end, as shown in FIG. 9 may be incorporated in heat sink 100, providing flow paths that are the longest near the base of the heat sink. As one of ordinary skill in the art may appreciate, there are various ways for compensating for the warming of air passing through the flow paths of a heat sink. For example, in FIG. 11, the thickness of base 120 can be varied, so that thermal mass that may be removed towards the outlet end can compensate for the warming of the air passing through the flow paths of a heat sink. FIG. 12A is a bottom view of duct 195 and fins 130. For various embodiments of heat sink 100 as depicted in FIG. 12A, the fins 130 may be arranged in an alternating pattern, so that a set of fins is shortened in length at the inlet side of the plurality of fins, thereby creating flow paths of variable lengths. For such a design as shown in FIG. 12A the base thickness may remain constant, as shown in FIG. 12B. Various embodiments of heat sink 100 may have fins 130 tapered in height from the inlet end to the outlet end, forming a trapezoidal shaped sectional view, as indicated by the hatched line as depicted in the sectional view of FIG. 13. Embodiments of a heat sink having fins tapered in height in such a fashion provide flow paths that are the longest near the base of the heat sink, similarly to that provided by embodiments of heat sink 100 shown in FIG. 9.

For various embodiments of a thermal block assembly 300 of FIG. 9, both the static and dynamic TNU may be between about 0.05° C. to about 0.25° C., for TNU determinations based on the average of the differences between the hottest and coldest wells in sample block 100. This translates into the difference between the hottest and coldest well of between about 0.10° C. to about 0.50° C., which is between about 2 to 10 times lower than the current standard in the art of about 1.0° C. Moreover, the static and dynamic TNU tend to be approximately the same in contrast the static and dynamic TNU for various embodiments of thermal block assembly including thermal block sub-assembly 200 of FIG. 8, and embodiments of a sample block depicted in FIG. 4. For such embodiments of thermal block assembly, the static TNU measured as the average of the differences between the hottest and coldest wells in a sample block may be between about 0.25° C. to about 0.50° C., while the dynamic TNU may be between about 0.70° C. to about 1.0° C.

Figure 14A:
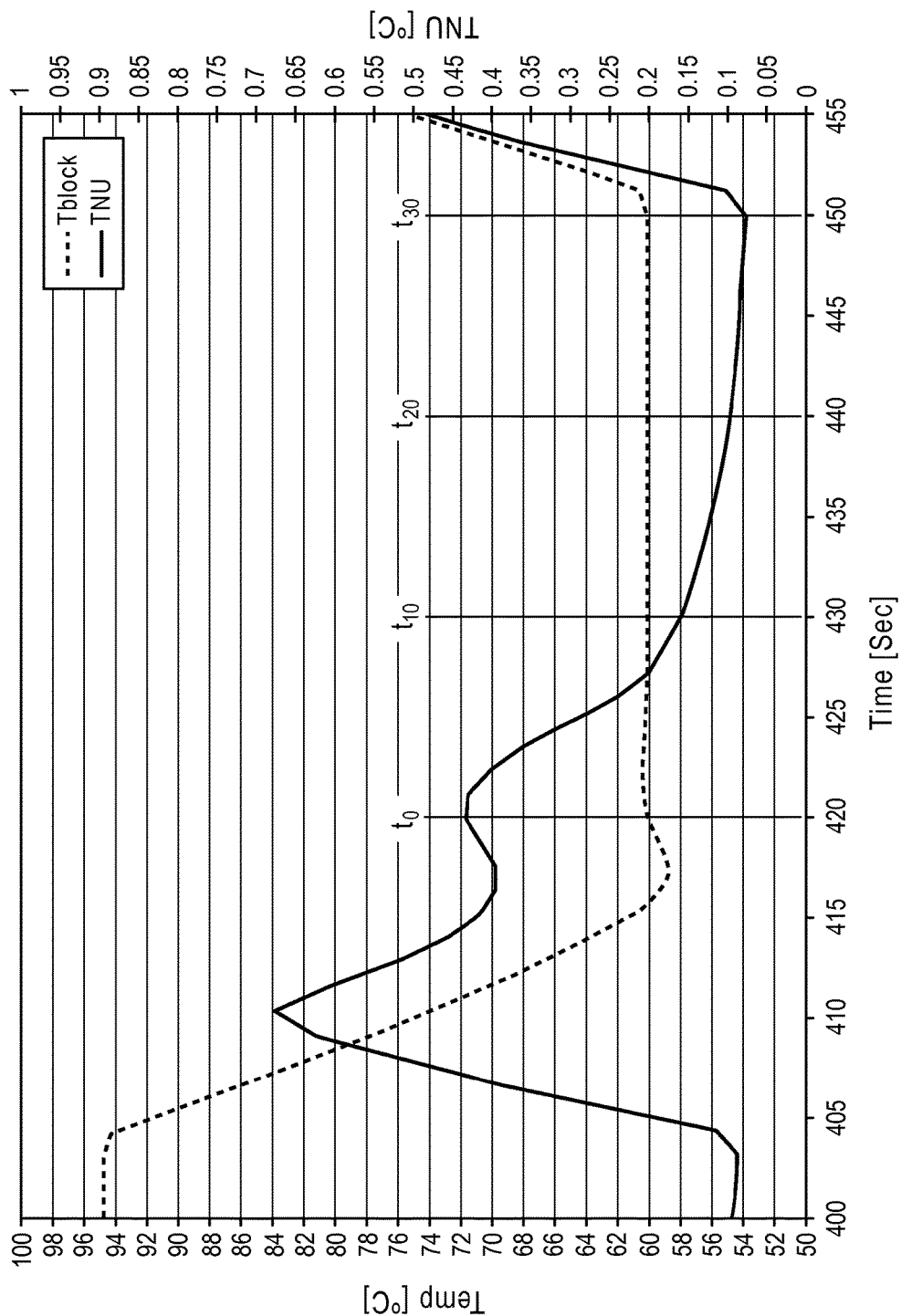
FIG. 14A is a graph depicting the block temperature and thermal non-uniformity of a thermal block assembly approaching and during a hold period for a setpoint temperature of 60° C.
Figure 14B:
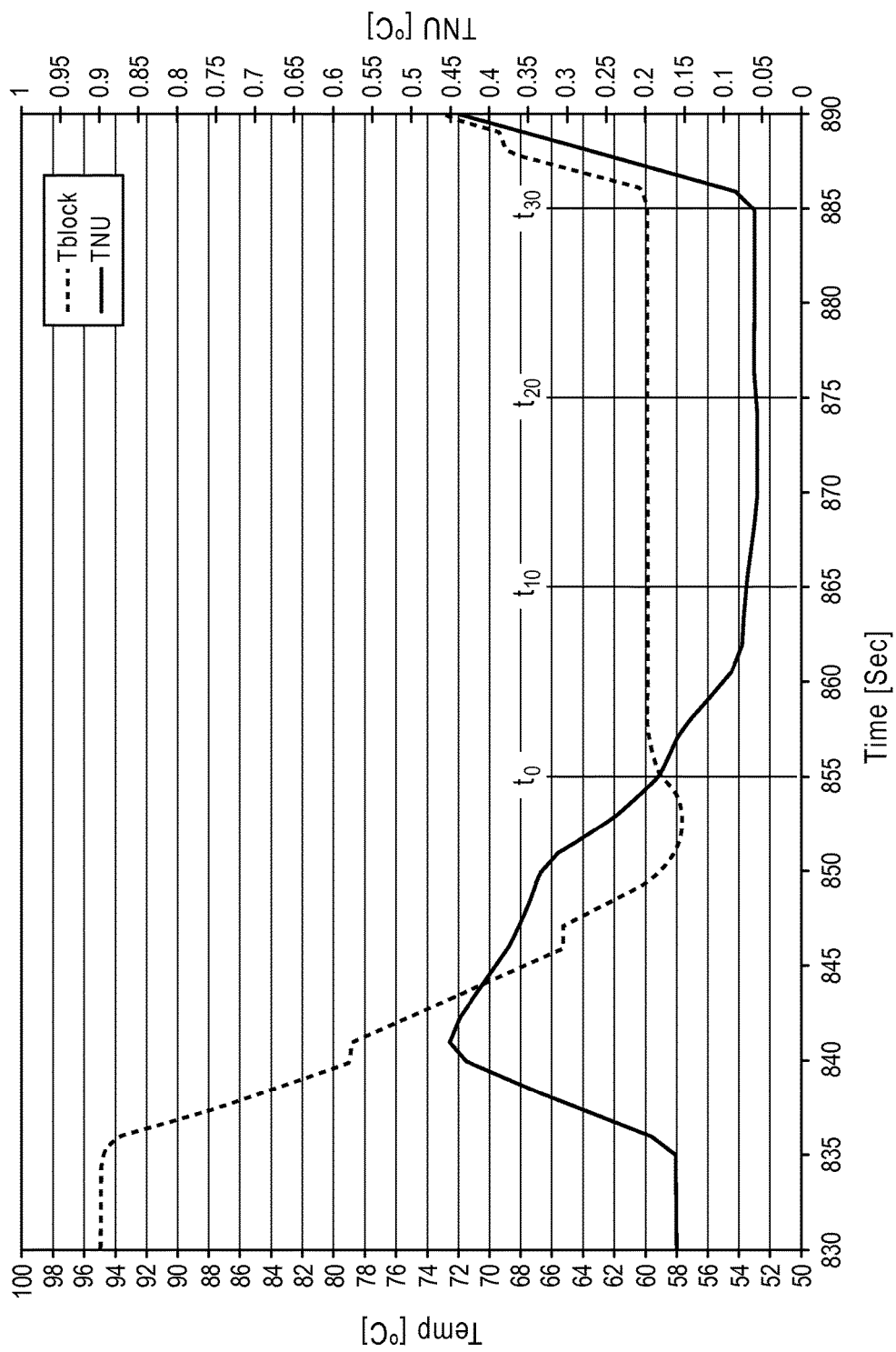
FIG. 14B is a graph depicting the block temperature and thermal non-uniformity of a thermal block assembly approaching and during a hold period for a setpoint temperature of 60° C., according to various embodiments.
Figure 15A:
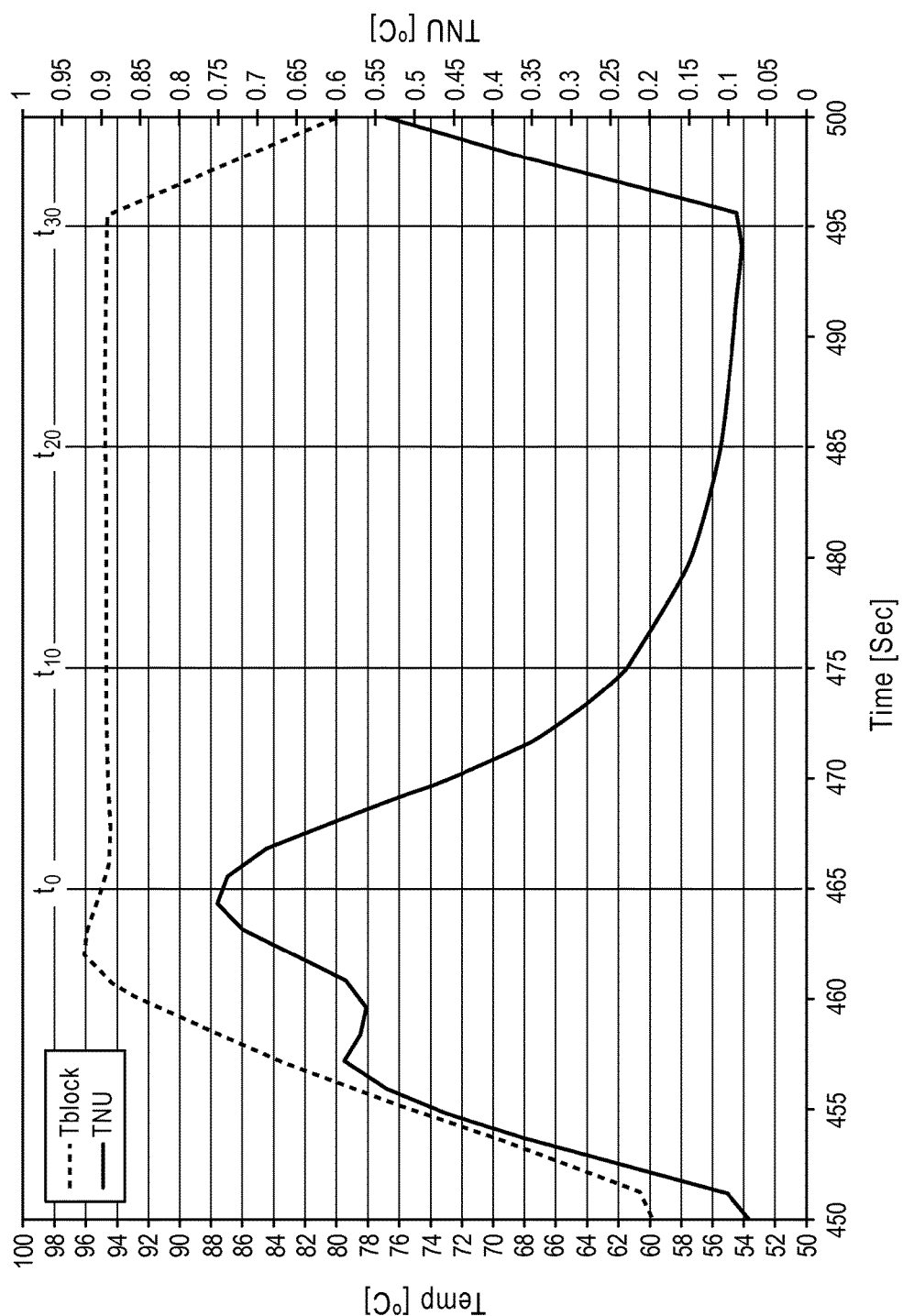
FIG. 15A is a graph depicting the block temperature and thermal non-uniformity of a thermal block assembly approaching and during a hold period for a setpoint temperature of 95° C., according to various embodiments.
Figure 15B:
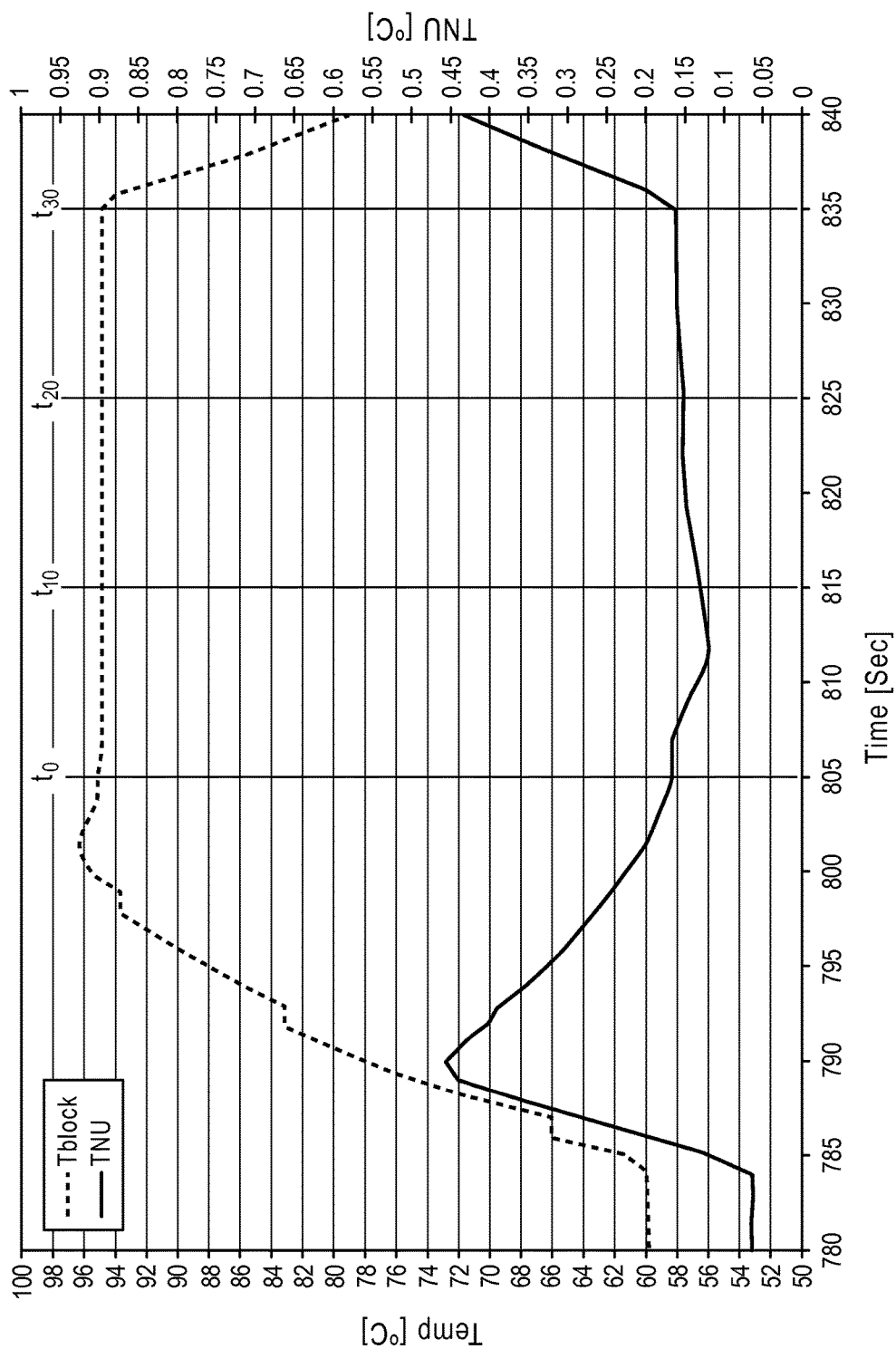
FIG. 15B is a graph depicting the block temperature and thermal non-uniformity of a thermal block assembly approaching and during a hold period for a setpoint temperature of 95° C.

Regarding the evaluation of various embodiments of a thermal block assembly 300 of FIG. 9, such data is provided in FIG. 14A and FIG. 14B, as well as in FIG. 15A and FIG. 15B. In FIG. 14A and FIG. 15A, a graph is depicted of a block temperature and TNU for an embodiment of a thermal block sub-assembly 200 of FIG. 8 utilizing an embodiment of a 384-well sample block of FIG. 4, which sample block also has an edge heater. In FIG. 14B and FIG. 15B, a graph is depicted of a block temperature and TNU for an embodiment of thermal block assembly 300 of FIG. 9, for which no edge heater was used in conjunction with the 384-well sample block. The graphs shown in FIGS. 14A and 14B represent a duration of time beginning before and lasting through a setpoint temperature of about 60° C. The graphs shown in FIG. 15A and FIG. 15B represent a duration of time beginning before and lasting through a setpoint temperature of about 95° C. The values of TNU are expressed as an average difference between the hottest and coldest wells in the sample block. A 9-channel fixture for validating temperature calibration and uniformity, equipped with 8 platinum resistance probes, and adapted for the continuous monitoring of a sample block was used to record the values for the TNU of the sample blocks.

In reviewing the TNU data for FIG. 14A and FIG. 15A, the range of TNU for data taken at a point about half way between $t_0$ and $t_{10}$, or at about $t_5$ for the 60° C. and 95° C. data sets is between about 0.28° C. to about 0.45° C. In comparison, for FIG. 14B and FIG. 15B the range of TNU for data taken at about $t_5$ for the 60° C. and 95° C. data sets is between about 0.08° C. to about 0.15° C. This is equivalent to a TNU range of about 0.16° C. to about 0.30° C. expressed as the difference, instead of an average difference. Therefore, for an embodiment of a thermal block assembly and instrument according to the present teachings, this is between about 3 to 6 times lower than a current standard in the art often recited as a difference of about 1.0° C. The essentially stable and constant nature of the TNU demonstrated by an embodiment of a thermal block assembly and instrument according to the present teachings as shown in FIG. 14B and FIG. 15B may be understood in comparison to the TNU shown in FIG. 14A and FIG. 15A. Over the range of times between clockstart plus about 5 seconds ($t_5$) and clockstart plus 10 seconds ($t_{10}$), the TNU in FIG. 14B and FIG. 15B appears to be essentially stable and constant for an embodiment of a thermal block assembly and instrument according to the present teachings, while the TNU in FIG. 14A and FIG. 15A displays a slope.

Moreover that dynamic and static TNU tend to be essentially the same value for various embodiments of a thermal block assembly and instrument of the present teachings may be understood in the comparison of FIG. 15A and FIG. 15B for the 95° C. data. As one of ordinary skill in the art of the physics and engineering of thermal cycling instrumentation is apprised, maintaining a transiently constant setpoint temperature in a sample block becomes more challenging as the setpoint temperature deviates significantly away from an ambient temperature of an operating instrument. In that regard, achieving an essential stable and constant TNU at a setpoint of about 95° C. may represent more of a challenge than achieving a stable TNU at a setpoint of about 60° C. For the thermal block assembly of FIG. 15A, the dynamic TNU measured at $t_0$ is about 0.75° C., which changes to a static TNU of about 0.45° C. at about $t_5$, and reaches a static TNU of about 0.08° C. at $t_{30}$. In contrast, for an embodiment of a thermal block assembly according to the present teachings in FIG. 15B, the dynamic TNU measured at $t_0$ is about 0.16° C. and remains fairly constant for a static TNU of about 0.14° C. at about $t_5$, continuing to remain stable and constant at $t_{30}$. Additionally, various embodiments of a thermal block assembly and instrument according to the present teachings may not require the use of an edge or perimeter heater in order to achieve a stable and constant TNU at a target setpoint.

Further, that the static and dynamic TNU's are about the same low value may have an impact on shortening cycle times as a result of shortening hold times. Recalling that the time-to-TNU is related to the cycle time, so that faster the time-to-TNU, the shorter the cycle time. For example, for bioassays using the PCR reaction, typically about 40 cycles are run per sample per analysis. Currently, for thermal cycling utilizing a standard format for end-point protocols, about 40 cycles may be completed in about 15 minutes, or about 23 seconds per cycle. Therefore, for example, by even reducing the cycle time to 15 seconds, this would translate into a run time of about 10 minutes, which is 6 runs an hour, instead of 4. The impact on both the quality of data as well as throughput may be significant for a variety of end users. According various embodiments of a thermal block assembly and instrument of the present teachings, a time-to-TNU may be up to about 5 seconds. In various embodiments of a thermal block assembly and instrument of the present teachings, a time-to-TNU may be up to about 7 seconds.

As previously noted, in reference to various embodiments of a thermal block assembly and instrument of the present teachings, the combined footprint of the plurality of thermal electric devices essentially or sufficiently matches the footprint of the second surface of the sample block and first surface of the heat sink to provide substantially uniform heat transfer throughout the thermal block assembly. The sufficient matching of the combined footprint of the thermal electric devices to the footprint of the second surface of the sample block and first surface of the heat sink may be borne out in the effective performance of various embodiments of a thermal block assembly and instrument of the present teachings.

Figure 17:
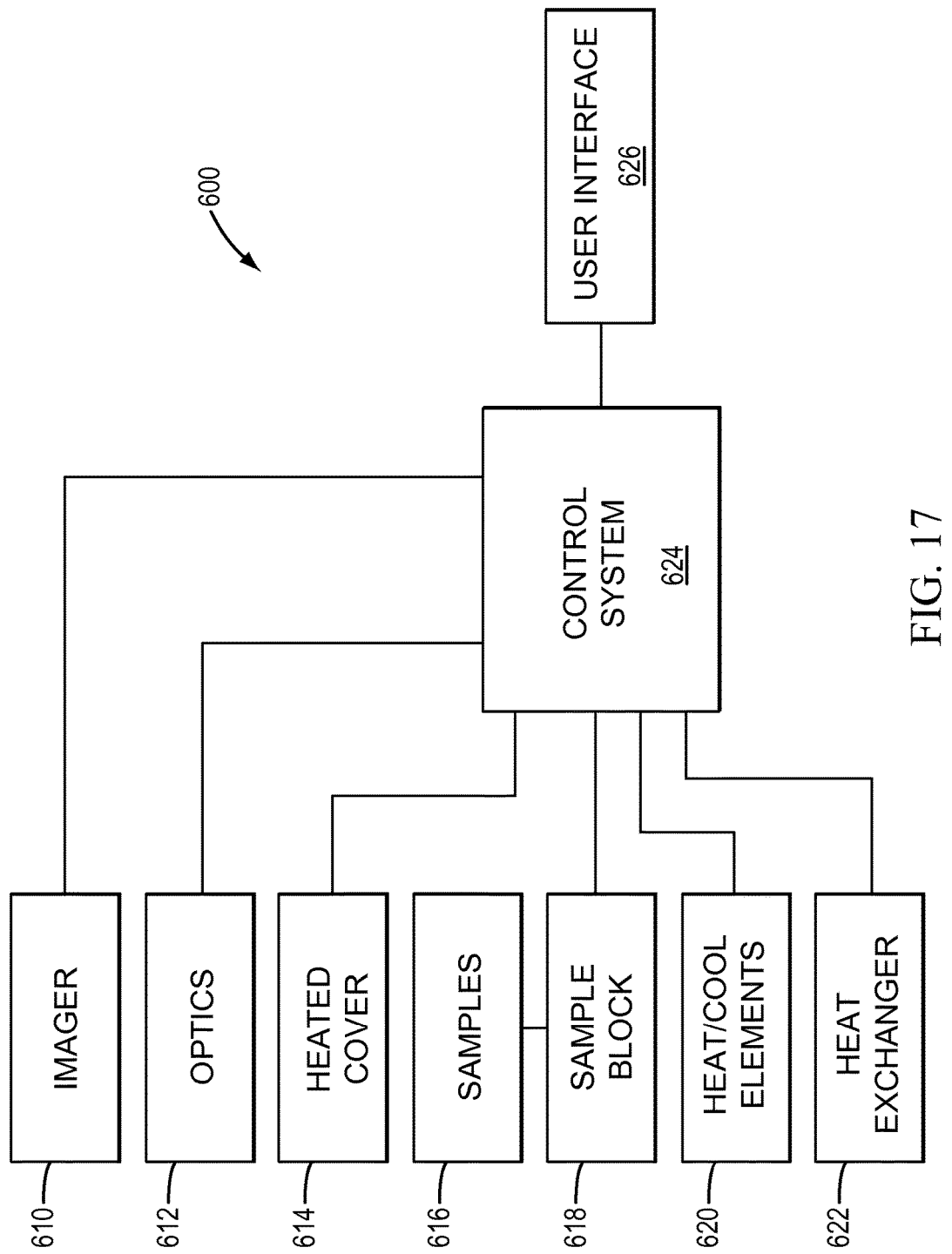
FIG. 17 is a block diagram of an instrument that may utilize various embodiments of a thermal block assembly.

Various embodiments of a thermal block assembly according to the present teachings may be used in various embodiments of a thermal cycler instrument as depicted in the block diagrams shown in FIG. 16 and FIG. 17.

According to various embodiments of a thermal cycler instrument 500, as shown in FIG. 16, a thermal cycling instrument may include a heated cover 510 that is placed over a plurality of samples 512 contained in a sample support device. In various embodiments, a sample support device may be a glass or plastic slide with a plurality of sample regions, which sample regions have a cover between the sample regions and heated lid 512. Some examples of a sample support device may include, but are not limited by, tubes, vials, a multi-well plate, such as a standard microtiter 96-well, a 384-well plate, or a microcard, or a substantially planar support, such as a glass or plastic slide. The sample regions in various embodiments of a sample support device may include through-holes depressions, indentations, ridges, and combinations thereof, patterned in regular or irregular arrays formed on the surface of the substrate. In various embodiments of a thermal cycler instrument, include a sample block 514, an element or elements for heating and cooling 516, and a heat exchanger 518. Various embodiments of a thermal block assembly according to the present teachings comprise components 514-518 of thermal cycler system 500 of FIG. 16.

Figure 18:
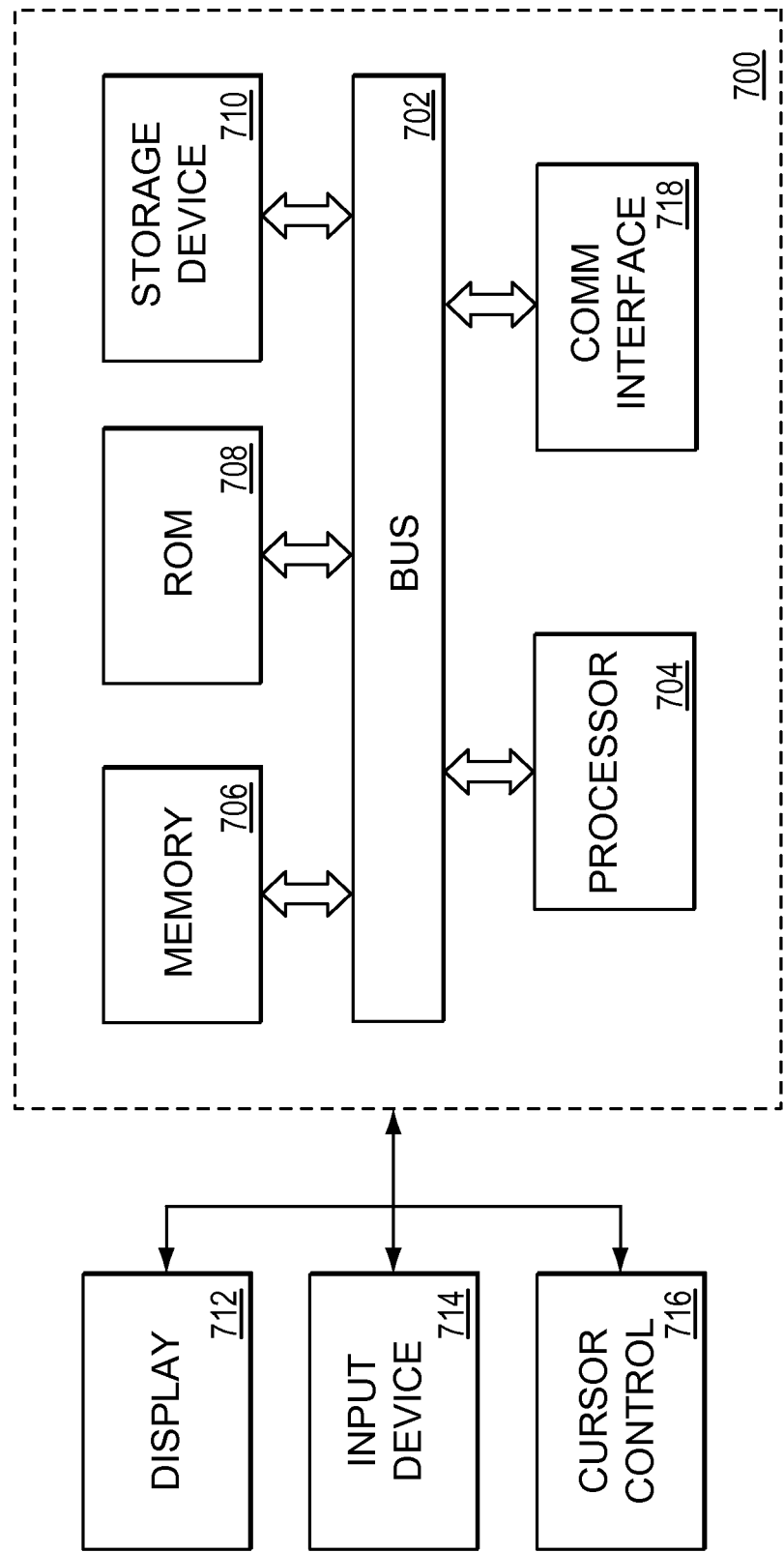
FIG. 18 is a block diagram that illustrates components of an exemplary computer system that may be utilized in the control and interface of instrumentation comprising various embodiments of a thermal block assembly.

In FIG. 17, various embodiments of a thermal cycling system 600 have the components of embodiments of thermal cycling instrument 500, and additionally a detection system. A detection system may have an illumination source that emits electromagnetic energy, and a detector or imager 610, for receiving electromagnetic energy from samples 616 in sample support device. For embodiments of thermal cycler instrumentation 500 and 600, a control system 530 and 624, respectively, may be used to control the functions of the detection, heated cover, and thermal block assembly. The control system may be accessible to an end user through user interface 522 of thermal cycler instrument 500 and 626 of thermal cycler instrument 600. A computer system 700, as depicted in FIG. 18 may serve as to provide the control the function of a thermal cycler instrument, as well as the user interface function. Additionally, computer system 700 may provide data processing and report preparation functions. All such instrument control functions may be dedicated locally to the thermal cycler instrument, or computer system 700 may provide remote control of part or all of the control, analysis, and reporting functions, as will be discussed in more detail subsequently.

FIG. 18 is a block diagram that illustrates a computer system 700, according to various embodiments, upon which embodiments of a thermal cycler system 500 of FIG. 16 or a thermal cycler system 600 of FIG. 17 may utilize. Computer system 700 includes a bus 702 or other communication mechanism for communicating information, and a processor 704 coupled with bus 702 for processing information. Computer system 700 also includes a memory 706, which can be a random access memory (RAM) or other dynamic storage device, coupled to bus 702 for instructions to be executed by processor 704. Memory 706 also may be used for storing temporary variables or other intermediate information during execution of instructions to be executed by processor 704. Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a cathode ray tube (CRT) or liquid crystal display (LCD), for displaying information to a computer user. An input device 714, including alphanumeric and other keys, is coupled to bus 702 for communicating information and command selections to processor 704. Another type of user input device is cursor control 716, such as a mouse, a trackball or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane. A computer system 700 provides data processing and provides a level of confidence for such data. Consistent with certain implementations of the invention, data processing and confidence values are provided by computer system 700 in response to processor 704 executing one or more sequences of one or more instructions contained in memory 706. Such instructions may be read into memory 706 from another computer-readable medium, such as storage device 710. Execution of the sequences of instructions contained in memory 706 causes processor 704 to perform the process states described herein. Alternatively hard-wired circuitry may be used in place of or in combination with software instructions to implement the invention. Thus implementations of the invention are not limited to any specific combination of hardware circuitry and software.

The term "computer-readable medium" as used herein refers to any media that participates in providing instructions to processor 704 for execution. Such a medium may take many forms, including but not limited to, non-volatile media, volatile media, and transmission media. Non-volatile media includes, for example, optical or magnetic disks, such as storage device 710. Volatile media includes dynamic memory, such as memory 706. Transmission media includes coaxial cables, copper wire, and fiber optics, including the wires that comprise bus 702. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 704 for execution. For example, the instructions may initially be carried on magnetic disk of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector coupled to bus 702 can receive the data carried in the infra-red signal and place the data on bus 702. Bus 702 carries the data to memory 706, from which processor 704 retrieves and executes the instructions. The instructions received by memory 706 may optionally be stored on storage device 710 either before or after execution by processor 704.

Further, it should be appreciated that a computer 700 of FIG. 18 may be embodied in any of a number of forms, such as a rack-mounted computer, a desktop computer, a laptop computer, or a tablet computer. According to various embodiments of a computer 700 of FIG. 18, a computer may be embedded in any number of mobile and web-based devices not generally regarded as a computer but with suitable processing capabilities. Example of such devices may include, but are not limited by a Personal Digital Assistant (PDA), a smart phone, and a notepad or any other suitable electronic device. Additionally, a computer system can include a conventional network system including a client/server environment and one or more database servers. A number of conventional network systems, including a local area network (LAN) or a wide area network (WAN), and including wireless and/or wired components, are known in the art. Additionally, client/server environments, database servers, and networks are well documented in the art.

While the principles of this invention have been described in connection with various embodiments of a thermal block assembly and instrument, it should be understood clearly that these descriptions are made only by way of example and are not intended to limit the scope of the invention. What has been disclosed herein has been provided for the purposes of illustration and description. It is not intended to be exhaustive or to limit what is disclosed to the precise forms described. Many modifications and variations will be apparent to the practitioner skilled in the art. What is disclosed was chosen and described in order to best explain the principles and practical application of the disclosed embodiments of the art described, thereby enabling others skilled in the art to understand the various embodiments and various modifications that are suited to the particular use contemplated. It is intended that the scope of what is disclosed be defined by the following claims and their equivalence.

What is claimed is:

1. A thermal block assembly for thermal cycling comprising:
   a sample block having a first surface and a second surface opposing the first surface having a sample block footprint wherein the first surface is adapted for receiving a sample support device;
   a heat sink comprising a base having a first surface having a first surface footprint, a second surface, and a plurality of fins pendent the second surface, wherein a space between each fin provides flow paths for air passing from an inlet side of the plurality of fins to an outlet side of the plurality of fins wherein the height of the plurality of fins varies to provide flow paths along the heat sink parallel to the second surface of the heat sink and longest near the base of the heat sink; and
   a plurality of thermal electric devices adjoined in the X-Y plane, positioned between the sample block and the heat sink;
   wherein the height of the plurality of fins varies along at least a portion of the heat sink that spans an active footprint of the plurality of thermal electric devices.

2. The thermal block assembly of claim 1, wherein a dynamic thermal non-uniformity of the sample block is an average value of between about 0.05° C. to about 0.25° C.

3. The thermal block assembly of claim 1, wherein a static thermal non-uniformity of the sample block is an average value of between about 0.05° C. to about 0.25° C.

4. The thermal block assembly of claim 1, wherein a time to reach an essentially stable thermal non-uniformity of the sample block after reaching a target setpoint temperature is up to about 5 seconds.

5. The thermal block assembly of claim 4, wherein the target setpoint temperature is a value based on a temperature measured in a plurality of samples in the sample support device.

6. The thermal block assembly of claim 4, wherein the target setpoint temperature is a value based on a temperature measured in a plurality of positions in the sample block.

7. The thermal block assembly of claim 4, wherein the essentially stable thermal non-uniformity of the sample block is an average value of between about 0.05° C. to about 0.25° C.

8. The thermal block assembly of claim 1, wherein a static thermal non-uniformity and a dynamic thermal non-uniformity of the sample block are essentially the same.

9. The thermal block assembly of claim 8, wherein the dynamic thermal non-uniformity and the static non-uniformity of the sample block are each an average value of between about 0.05° C. to about 0.25° C.

10. The thermal block assembly of claim 8, wherein the static thermal non-uniformity and the dynamic thermal non-uniformity of the sample block are essentially the same at a defined time during a thermal cycle.

11. The thermal block assembly of claim 10, wherein the defined time during a thermal cycle is a defined clock start.

12. The thermal block assembly of claim 11, wherein the defined clock start is initiated within about 1° C. of a target setpoint temperature of a thermal cycle.

13. The thermal block assembly of claim 12, wherein setpoint temperature is a value based on a temperature measured in a plurality of samples in the sample support device.

14. The thermal block assembly of claim 12, wherein the setpoint temperature is a value based on a temperature measured in a plurality of positions in the sample block.

15. The thermal block assembly of claim 1, further comprising a fan sub-assembly comprising a fan and a duct, wherein the fan sub-assembly is positioned to provide airflow through the flow paths of the fins from the inlet side of the plurality of fins to the outlet side of the plurality of fins.

16. The thermal block assembly of claim 15, wherein the duct provides a uniform flow path from the fan to the inlet side of plurality of fins.

17. The thermal block assembly of claim 15, wherein the duct is positioned proximal to the inlet side of the plurality of fins, such that the width of a gap between the duct and the inlet side may be not more than the width provided by the flow paths.

18. The thermal block assembly of claim 1, wherein the sample block comprises a flange optimized by modeling to reduce the horizontal flow of heat, thereby reducing the sample block thermal non-uniformity.

19. The thermal block assembly of claim 1, wherein the sample block comprises a first side surface, a second side surface, a third side surface, and a fourth side surface, and wherein the uniform thermal mass across the sample block is achieved by a combination of removing and adding mass from selected regions of each of the side surface.

20. An apparatus comprising:
   a control system; and
   a thermal block assembly comprising:
   a sample block having a first surface and a second surface opposing the first surface having a sample block footprint wherein the first surface is adapted for receiving a sample support device;
   a heat sink comprising a base having a first surface, a first surface footprint, a second surface and a plurality of fins pendent the second surface, wherein a space between each fin provides flow paths for air passing from an inlet side of the plurality of fins to an outlet side the plurality of fins, wherein the height of the plurality of fins varies to provide flow paths along the heat sink parallel to the second surface of the heat sink and longest near the base of the heat sink; and a plurality of thermal electric devices adjoined in the X-Y plane, positioned between the sample block and the heat sink;

wherein the height of the plurality of fins varies along at least a portion of the heat sink that spans an active footprint of the plurality of thermal electric devices.

21. The apparatus of claim 20, wherein a dynamic thermal non-uniformity of the sample block is an average value of between about 0.05° C. to about 0.25° C.

22. The apparatus of claim 20, wherein a static thermal non-uniformity of the sample block is an average value of between about 0.05° C. to about 0.25° C.

23. The apparatus of claim 20, wherein a time to reach an essentially stable thermal non-uniformity of the sample block after reaching a target setpoint temperature is up to about 5 seconds.

24. The apparatus of claim 23, wherein the target setpoint temperature is a value based on a temperature measured in a plurality of samples in the sample support device.

25. The apparatus of claim 23, wherein the target setpoint temperature is a value based on a temperature measured in a plurality of positions in the sample block.

26. The apparatus of claim 23, wherein the essentially stable thermal non-uniformity of the sample block is an average value of between about 0.05° C. to about 0.25° C.

27. The apparatus of claim 20, wherein a static thermal non-uniformity and a dynamic thermal non-uniformity of the sample block are essentially the same.

28. The apparatus of claim 27, wherein the dynamic thermal non-uniformity and the static non-uniformity of the sample block are each an average value of between about 0.05° C. to about 0.25° C.

29. The apparatus of claim 27, wherein the static thermal non-uniformity and the dynamic thermal non-uniformity of the sample block are essentially the same at a defined time during a thermal cycle.

30. The apparatus of claim 29, wherein the defined time during a thermal cycle is a defined clock start.

31. The apparatus of claim 30, wherein the defined clock start is initiated within about 1° C. of a target setpoint temperature of a thermal cycle.

32. The apparatus of claim 31, wherein the setpoint temperature is a value based on a temperature measured in a plurality of samples in the sample support device.

33. The apparatus of claim 31, wherein the setpoint temperature is a value based on a temperature measured in a plurality of positions in the sample block.

34. The apparatus of claim 20, further comprising a fan sub-assembly comprising a fan and a duct, wherein the fan sub-assembly is positioned to provide airflow through the flow paths of the fins from the inlet side of the plurality of fins to the outlet side of the plurality of fins.

35. The apparatus of claim 34, wherein the duct provides a uniform flow path from the fan to the inlet side of plurality of fins.

36. The apparatus of claim 34, wherein the duct is positioned proximal to the inlet side of the plurality of fins, such that the width of a gap between the duct and the inlet side may be not more than the width provided by the flow paths.

37. The apparatus of claim 20, wherein the sample block comprises a flange optimized by modeling to reduce the horizontal flow of heat, thereby reducing the sample block thermal non-uniformity.

38. The apparatus of claim 20, wherein the sample block comprises a first side surface, a second side surface, a third side surface, and a fourth side surface, and wherein the uniform thermal mass across the sample block is achieved by a combination of removing and adding mass from selected regions of each of the side surfaces.

* * * * *